(12) United States Patent
Saeki et al.

(10) Patent No.: US 6,581,184 B1
(45) Date of Patent: Jun. 17, 2003

(54) METHOD AND CIRCUIT FOR INCLUDING PARITY BITS IN WRITE DATA OF A MASS DATA STORAGE DEVICE, OR THE LIKE, USING A 48/54 MTR (3:K) CODE CONSTRAINT, AND POST-PROCESSING CIRCUIT AND METHOD FOR PROCESSING READ BACK DATA THAT INCLUDES SAID CODE CONSTRAINT

(75) Inventors: Koshiro Saeki, Irvine, CA (US); Michael J. Palmer, Lagune Miguel, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/547,387

(22) Filed: Apr. 11, 2000

(51) Int. Cl.⁷ .......................... H03M 13/00; G06F 11/00
(52) U.S. Cl. ........................................ 714/800; 714/701
(58) Field of Search ............................... 714/800, 802, 714/809, 805, 701

(56) References Cited

U.S. PATENT DOCUMENTS

| | | | | |
|---|---|---|---|---|
| 5,771,245 A | * | 6/1998 | Zhang | 714/701 |
| 6,185,173 B1 | * | 2/2001 | Livingston et al. | 360/53 |
| 6,388,587 B1 | * | 5/2002 | Brickner et al. | 341/59 |

OTHER PUBLICATIONS

Nishiya, et al., "Turbo–EEPRML: An EEPR4 Channel with an Error–Correcting Post–Processor Designed for 16/17 Rate Quasi–MTR Code", Proc. of GLOBECOM '93, pp. 2706–2711 (1988).

Kobayashi, et al., "Application of Erasure Error Correction to Concatenated Partial–Response Channel Code", 1999 IEEE Int'l, Conf. on Communications, vol. 3, pp. 1627–1631 (1999).

Aziz, et al., "A Rate 16/17 Punctured MTR Block Code", 1999 IEEE Int'l Conf. on Communications, vol. 3, pp. 1643–1647 (1999).

Bliss, "An 8/9 Rate Time–Varying Trellis Code for High Density Magnetic Recording", IEEE Trans. Magnetics, vol. 33, pp. 2746–2748 (1997).

Conway, "A New Target Response with Parity Coding for High Density Magnetic Recording Channels", IEEE Trans. Magnetics, vol. 34, pp. 2382–2386, 7/98.

Wu, et al., "Interleaved Parity Check Codes and Reduced Complexity Detection", 1999 IEEE Int'l. Conf. on Communications, vol. 3, pp. 1648–1652 (1999).

* cited by examiner

*Primary Examiner*—Albert Decady
*Assistant Examiner*—C Britt
(74) *Attorney, Agent, or Firm*—W. Daniel Swayze, Jr.; W. James Brady; Frederick J. Telecky, Jr.

(57) ABSTRACT

A method for writing data to a mass data storage device (10) includes applying a maximum transition run length code constraint to the data to be written, generating parity data based on the data, and inserting the parity data into the data to be written (5A–C). The parity data is used in conjunction with a post-processor (66) to detect and correct errors in the read back data.

18 Claims, 12 Drawing Sheets

| CODE | 16/17(0.6/8) | LORENTZIAN USER DENSITY=3.0 32 STATE VITERBI DETECTOR 16/17 MTR(3:11) |
|---|---|---|
| BIT ERROR RATE | 3.00E-04 | 5.50E-05 |
| ERROR PATTERN | | |
| ex=+-{1} EVENT | 4.1% | 21.1% |
| ex=+-{1,-1} EVENT | 7.6% | 25.6% |
| ex=+-{1,-1,1} EVENT | 68.6% | 51.7% |
| ex=+-{1,-1,1,-1} EVENT | 1.3% | |
| ex=+-{1,-1,1,-1,1} EVENT | 10.4% | |
| ex=+-{1,-1,1,-1,1,-1} EVENT | 0.7% | |
| ex=+-{1,-1,1,-1,1,-1,1} EVENT | 2.1% | |
| ex=+-{1,0,1} EVENT | 0.0% | 0.0% |
| ex=+-{1,0,0,1} EVENT | 0.0% | 0.1% |
| OTHERS | 5.2% | 1.5% |

| CODE | 16/17(0,6/8) | LORENTZIAN<br>Ud: INDEPENDENT<br>32 STATE VITERBI DETECTOR<br>16/17 MTR(3:11) |
|---|---|---|
| BIT ERROR RATE | 4.00E-04 | 8.10E-05 |
| ERROR PATTERN | | |
| ex=+-{1} EVENT | 35.7% | 91.8% |
| ex=+-{1,-1} EVENT | 14.2% | 5.3% |
| ex=+-{1,-1,1} EVENT | 18.7% | 1.9% |
| ex=+-{1,-1,1,-1} EVENT | 12.8% | |
| ex=+-{1,-1,1,-1,1} EVENT | 6.8% | |
| ex=+-{1,-1,1,-1,1,-1} EVENT | 1.2% | |
| ex=+-{1,-1,1,-1,1,-1,1} EVENT | 5.5% | |
| ex=+-{1,0,1} EVENT | 0.1% | 0.4% |
| ex=+-{1,0,0,1} EVENT | 0.1% | 0.1% |
| OTHERS | 4.9% | 0.5% |

FIG. 3

| | WRITE CURRENT SEQUENCE | | | | | | | | | | | | | | | | | PARITY DOUBLE | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | ODD | EVEN |
| ORIGINAL WRITE CURRENT | 1 | 0 | 0 | 1 | 0 | 1 | 1 | 0 | 1 | 0 | 1 | 1 | 1 | 0 | 0 | 1 | 0 | | |
| ODD | 1 | | 0 | | 0 | | 1 | | 1 | | 1 | | 1 | | 0 | | 0 | 1 | |
| EVEN | | 0 | | 1 | | 1 | | 0 | | 0 | | 1 | | 0 | | 1 | | | 1 |
| ex={1} | 1 | 0 | 0 | 1 | 0 | 1 | 1 | 0 | 0 | 0 | 1 | 1 | 1 | 0 | 0 | 1 | 0 | | |
| ODD | 1 | | 0 | | 0 | | 1 | | 0 | | 1 | | 1 | | 0 | | 0 | 0 | |
| EVEN | | 0 | | 1 | | 1 | | 0 | | 0 | | 1 | | 0 | | 1 | | | 1 |
| ex={1,-1} | 1 | 0 | 0 | 1 | 0 | 1 | 1 | 0 | 0 | 1 | 1 | 1 | 1 | 0 | 0 | 1 | 0 | | |
| ODD | 1 | | 0 | | 0 | | 1 | | 0 | | 1 | | 1 | | 0 | | 0 | 0 | |
| EVEN | | 0 | | 1 | | 1 | | 0 | | 1 | | 1 | | 0 | | 1 | | | 0 |
| ex={1-1,1} | 1 | 0 | 0 | 1 | 0 | 1 | 1 | 0 | 0 | 1 | 0 | 1 | 1 | 0 | 0 | 1 | 0 | | |
| ODD | 1 | | 0 | | 0 | | 1 | | 0 | | 0 | | 1 | | 0 | | 0 | 1 | |
| EVEN | | 0 | | 1 | | 1 | | 0 | | 1 | | 1 | | 0 | | 1 | | | 0 |
| ex={1,0,1} | 1 | 0 | 0 | 1 | 0 | 1 | 1 | 0 | 0 | 0 | 1 | 1 | 0 | 0 | 0 | 1 | 0 | | |
| ODD | 1 | | 0 | | 0 | | 1 | | 0 | | 1 | | 0 | | 0 | | 0 | 1 | |
| EVEN | | 0 | | 1 | | 1 | | 0 | | 0 | | 1 | | 0 | | 1 | | | 1 |
| ex={1,0,0,1} | 1 | 0 | 0 | 1 | 0 | 1 | 1 | 0 | 0 | 0 | 1 | 0 | 1 | 0 | 0 | 1 | 0 | | |
| ODD | 1 | | 0 | | 0 | | 1 | | 0 | | 1 | | 1 | | 0 | | 0 | 0 | |
| EVEN | | 0 | | 1 | | 1 | | 0 | | 0 | | 0 | | 0 | | 1 | | | 0 |

FIG. 4

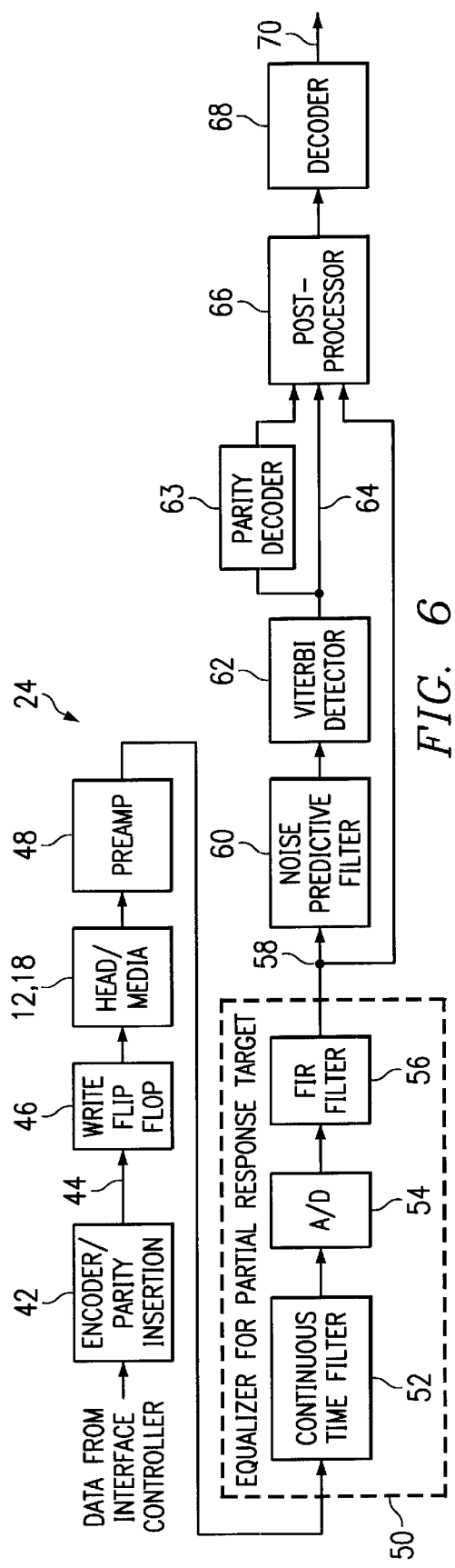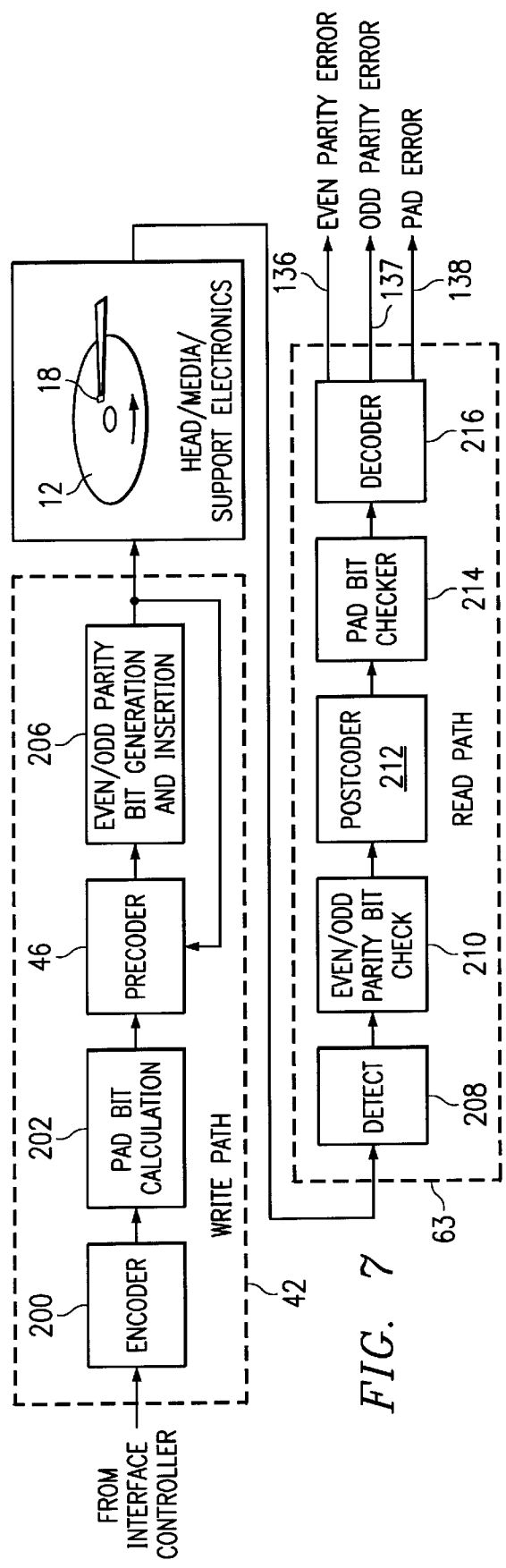

$y_k = x_k + y_{k-1} = x_k/(1+D)$

'+' = MODULE 2 ADDITION (XOR)
'D' = DELAY (DFF)

$x_k = y_k + y_{k-1} = y_k(1+D)$

'+' = MODULE 2 ADDITION (XOR)
'D' = DELAY (DFF)

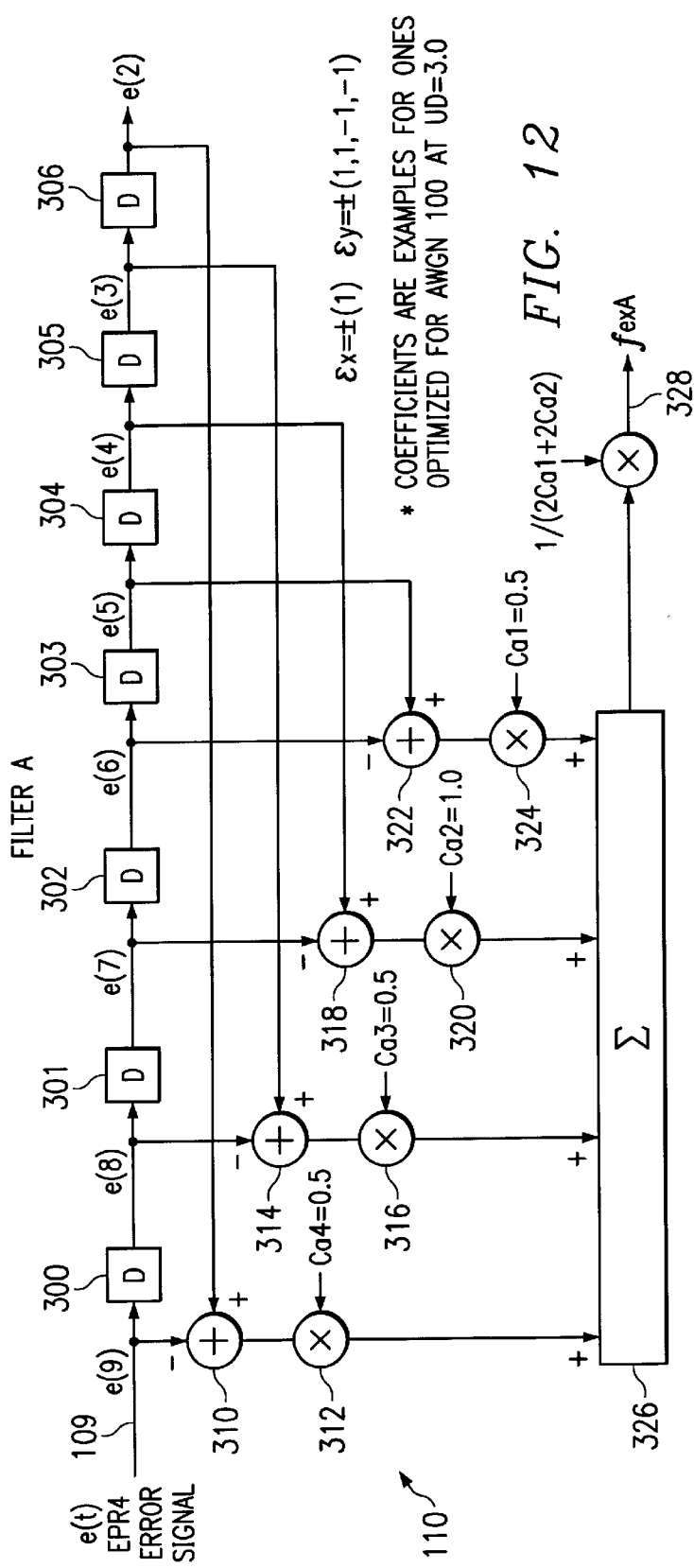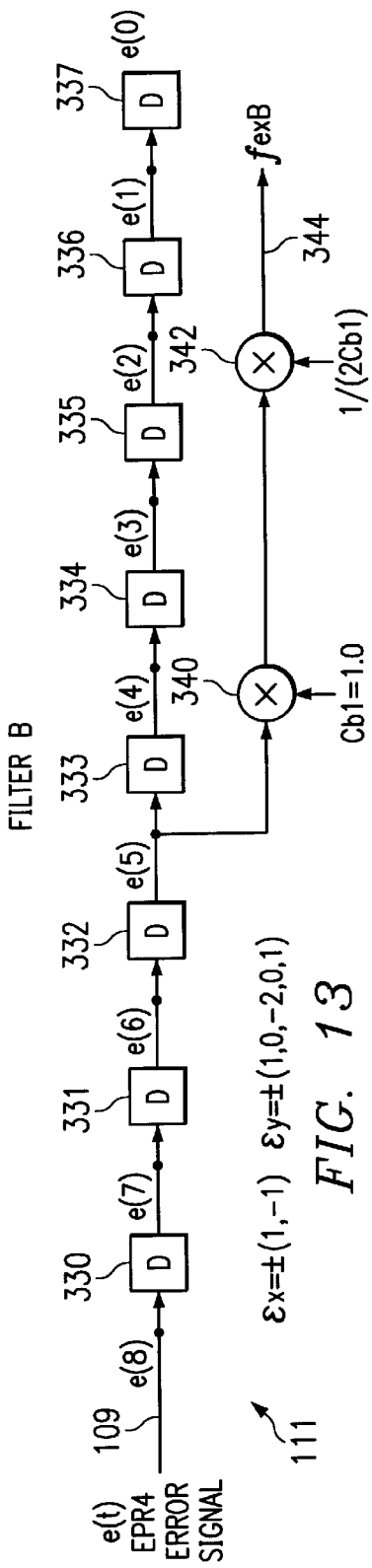
FIG. 12
FIG. 13

METHOD AND CIRCUIT FOR INCLUDING PARITY BITS IN WRITE DATA OF A MASS DATA STORAGE DEVICE, OR THE LIKE, USING A 48/54 MTR (3:K) CODE CONSTRAINT, AND POST-PROCESSING CIRCUIT AND METHOD FOR PROCESSING READ BACK DATA THAT INCLUDES SAID CODE CONSTRAINT

BACKGROUND OF THE INVENTION

1. Field of the Invention

This invention relates to improvements in methods and apparatuses for dynamic information storage or retrieval, and more particularly to improvements in methods and circuitry for detection and correction of errors, especially in information storage and retrieval systems that use a magnetic data storage medium, and still more particularly to improvements in methods and apparatuses for improving data detection in dynamic information storage or retrieval systems of the type that use post-processor data detection techniques.

2. Relevant Background

Mass data storage devices may include, for example, hard disk drive apparatuses (HDA), or other similar data recording devices. Mass data storage devices include well known hard disk drives that have one or more spinning magnetic disks or platters onto which data is recorded for storage and subsequent retrieval. Hard disk drives may be used in many applications, including personal computers, set top boxes, video and television applications, audio applications, or some mix thereof. Many applications are still being developed. Applications for hard disk drives are increasing in number, and are expected to further increase in the future.

A typical hard disk drive includes one or more spinning discs that are coated with a magnetic material so that data can be written to and read from concentric rings in the magnetic media of the disk by one or more magnetic transducer devices that are located in proximity to the disc and selectively located to particular rings in which the data is written. Mass data storage devices may include other types of devices that are susceptible to the same type of error creating mechanisms as HDAs.

In the construction of the data channel used in hard disk drives, or the like, there has been significant recent interest in Partial Response Maximum-likelihood (PRML) signaling techniques. The most common PRML systems are PR4ML (a partial response class 4) and EPR4ML (extended partial response class 4). Maximum-likelihood detectors, which use a Viterbi algorithm, are generally used for these partial response channels.

Recently, an EPR4 channel has been introduced. In comparison to previously used PR4 partial response target, which is 1−D)*1+D), the EPR4 partial response target, which is 1−D)*1+D)$^2$, where D is a delay operator, equal to $e^{jw\tau}$, where w is frequency, and $\tau$ is delay time.

In such systems, the use of EPR4 Viterbi data detection techniques is widely employed. EPR4 Viterbi detectors are well known, and involve probabilistic techniques for determining data states in the data channel. As data rates increase in the data channel, it becomes increasingly difficult to distinguish adjacent data pulses, and the Viterbi techniques have been found to be very useful.

Unfortunately, significant errors still occur in data detection. For example, using EPR4 techniques, a bit error rate (BER) of about $10^{-5}$ typically occurs. As the data packing densities are increased, the more difficult the accurate read back of the data becomes. For example, bit error rates (BERs) in the neighborhood of $10^{-7}$, or better, are presently being expected of modern day HDA's, and it is expected that this requirement will continue to become more stringent. However it has been observed that if the signal-to-noise ratio in a system could be reduced by even as little as, for example, 1 dB, the bit error rate can be improved by an order of magnitude improvement. Thus, even small improvements in the signal-to-noise ratio results in large improvements in the bit error rate using EPR4 detection techniques.

In the past, a typical EPR4 circuit would receive an input signal that has been amplified by a pre-amplifier from the data transducer of the storage device. The amplified signal is applied to an EPR4 equalizer that produces an output that is detected by an EPR4 Viterbi detector. The output from the EPR4 Viterbi detector typically contains the desired data which has been decoded using the above mentioned probabilistic techniques.

Partial response channels are subject to certain error-events. An error event occurs when the channel symbol that represents the polarity of a write current is misread. It should be noted that as data is written to the magnetic medium, it is written synchronously with a clock that requires the data at each clock cycle to assume a particular state. In addition, the nomenclature used to represent the write current sequence is referred to as "non-return-to-zero" or "NRZ" notation. The number of MTR states is cut in half by using "non-return-to-zero-inverse" or "NRZI" notation, where a zero corresponds to no transition, and a one corresponds to a transition. Consequently, the initial coding done on data to be written is to NRZI data.

In many recent applications, maximum transition run length (MTR) coding has used to improve the performance of partial response channels. In MTR coding, a number of input bits are mapped to a larger number of possible bits. For example, a typical MTR code is a 16/17 coding in which 16 input bits are mapped to a 17-bit frame. Thus, after characterizing a magnetic recording partial response channel, a list of dominant error-events is compiled. Then, an MTR code is designed so that code mappings do not contain any dominant error-events. However, merely constraining the sequences to a given coding constraint is not enough to obtain a significant coding gain. Rather, a Viterbi detector which is matched to the combination of the channel and the code must be used to insure that the detected sequence is allowed by the constraint.

Additionally, MTR codes eliminate certain consecutive transition errors. By removing certain transitions possibilities, corresponding write current sequences are not allowed. Therefore, many of the dominant error-events at high densities are removed along with many other likely error-events. Such code reduces the number of transitions and increases the spacing between transitions.

Thus, MTR coding permits a predetermined number of consecutive transitions, and prohibits a predetermined number of consecutive non-transitions. A transition for purposes of MTR coding is either a transition from 0 to 1 or a transition from 1 to 0. The basic idea of MTR coding is to eliminate certain input bit patterns that would cause most error-events in a sequence detector. For example, a MTR (3:11) coding requires that no more than three consecutive input transitions occur, and that no input condition results in more than 11 consecutive time periods during which no transition occurs. This eliminates four or more consecutive transitions, and eliminates 12 or more non-transitions. With the MTR constraint, precompensation can be performed more accurately.

In general, the MTR constraint removes branches and/or states from the Viterbi detector for the channel. Therefore, MTR coding provides coding gain at high densities without adding complexity to the system. While MTR codes provide coding gain without adding complexity, a number of error conditions still remain, particularly in the presence of additive white Gaussian noise (AWGN) and media noise. Moreover, as the processing level is increased, several problems have emerged. For example, although the EPR4 channel yields better performance than the PR4 channel for higher recording densities, the complexity of the Viterbi detector used in an EPR4 channel increases by more than twice, and the maximum data rate decreases. In order to avoid these drawbacks, several techniques have been proposed.

One technique is the use of a post-processor. Since a post-processor can use the same metric as an EPR4 Viterbi detector, the criteria used to correct minimum distance error-events can be the same criteria as those used in an EPR4 Viterbi detector to select survivor paths. The main benefits to such post-processing approaches is reduced complexity in the feedback path associated with the updating process for the Viterbi detector, allowing for higher channel rates.

Thus, in order to enhance the BER performance, recently, post-processors have been incorporated with the Viterbi detector. An example of such post-processor is that shown in U.S. patent application Ser. No. 09/229,945, filed Jan. 13, 1999, entitled POST-PROCESSOR USING A NOISE WHITENED MATCHED FILTER FOR A MASS DATA STORAGE DEVICE, OR THE LIKE, assigned to the assignee hereof, and incorporated herein by reference. In said patent application, a post-processor was described that employed data filters to filter equalized or recreated write data after being read back from the memory media. The filter produced an error signal that was above a predetermined threshold when particular error events occurred. The error events that were selected were those that had the highest likelihood of occurring. By addressing those particular error events, the bit error rate (BER) of the system was greatly improved. However, in recent disk drives that have a high recording density, the media noise from the magnetic disk has become an important factor that is difficult to ignore.

The media noise arises primarily from written magnetic transitions, which typically have a zigzag transition geometry. The zigzag transition geometry produces position or pulse width uncertainties or "Jitter" variations of read back signals. When media noise is dominant, it is difficult for such post-processors to improve performance, since the characteristic of media noise is quite different from white noise. The spectrum of the media noise is not white, and is dependent on the data pattern written on the magnetic disk.

Another technique that has been used to avoid the drawbacks encountered is to use parity values written to the disk in conjunction with the user data. The parity values may be generated in various ways, but, in general, the parity code bits generated represent certain characteristics of the data that is written so that when the data is subsequently read back from the disk, together with the prerecorded parity value, and a parity value is regenerated from the read back data, if a discrepancy exists, it can be assumed that an error has occurred in the read back data. The use of parity values, however, in the past has only provided an indication that an error has occurred, but does not usually enable the error position to be determined or the error to be corrected.

Recently, one or more parity bits have been used in conjunction with post-processing circuitry, but without any constraints being imposed on the run length encoding of the data written to the HDA. As a result, the post-processor must detect and correct a large number of various error conditions, necessitating very complex post-processing circuitry.

SUMMARY OF THE INVENTION

In light of the above, it is, therefor, an object of the invention to provide an improved method for performing error correction in writing data to and reading data from a mass data storage device.

It is another object of the invention to provide a method for including parity data in combination with maximum transition run length constraints on data that is written to and read from a mass data storage device.

It is yet another object of the invention to provide a method for encoding data that includes parity code data in a system that has a MTR(3:11) code constraint.

It is still another object of the invention to provide a method and circuit for performing post-processing of data that includes parity information read from a mass data storage device, in which errors are detected and corrected using error filters to detect specific error sequences in conjunction with the recovered parity information.

We have found that by additionally including parity information in the post-processor, and more over including run length limited coding techniques, that the bit error rate can be significantly further reduced.

Thus, according to a broad aspect of the invention, a method is presented for writing data to a mass data storage device. The method includes applying a maximum transition run length code constraint to the data to be written and developing parity data based on the predetermined number of bits of the data to be written. The method also includes concatenating the parity data with the data to be written and writing the concatenated data to the mass data storage device. Developing the parity data may include developing three parity bits, a center one of the parity bits being a "pad" bit, wherein the "pad" bit is selected to avoid code constraint violations by the parity data concatenated to the data, to be written. The code constraint may be, for example, a MTR (3:k) code constraint.

According to yet another broad aspect of the invention, a post-processor is presented for use in a mass data storage device to which parity information has been written together with MTR encoded data. The post-processor includes an equalizer to equalize data and the parity information read back from the mass data storage device to an EPR4 target and a filter connected to receive data and parity information which has been read back from the mass data storage device and equalized to an EPR4 target to produce a maximum output in the presence of a predetermined error pattern. A parity checker produces an output if the recorded parity on the memory element does not match recalculated parity information, and a circuit corrects the read back data at a bit position indicated by the maximum value of the filter when the parity checker determines that the recorded parity and recalculated parity are different.

According to another broad aspect of the invention, a mass data storage device is presented which includes a circuit for encoding data to be written to the mass data storage device with at least a maximum transition run length constraint. A circuit determines parity information from, and associates the parity information with, the data to be written to a storage media of the mass data storage device. A circuit reads back the data and parity information from the storage media, and a parity checker recalculates parity information from the read back data. The parity checker produces an output indicating whether the read back parity and recalculated parity information do not match. A post-processor circuit including at least one filter detects an error pattern in the read back data, and to correct the read back data using the parity checker output if the error pattern is detected. The post-processor may include, for example, three filters to respectively determine the occurrence of ex=±{1}, ex=±{1,-1}, and ex=±{1,-1,1} error event contributors.

The parity information may be concatenated between adjacent data frames, and may include parity information about even bits in a data frame, parity information about odd bits in the data frame, and a pad bit. The pat bit may be configured to assure that no maximum transition run length code constraint is violated when the parity information is concatenated between adjacent data frames.

BRIEF DESCRIPTION OF THE DRAWINGS

The invention is illustrated in the accompanying drawings, in which:

FIG. 3 shows a table showing error event patterns for a data stream model containing 100% media noise.

FIG. 4 shows a table illustrating an example of how the resulting parity bits for each of a number of error patterns for which the present invention is preferably designed.

FIG. 6 shows a block diagram of a PRML read channel for a magnetic recording device incorporating the use of a post-processor and parity information, in accordance with a preferred embodiment of the invention.

FIG. 7 shows the sequence in which parity bits may be inserted into the data stream and subsequently decoded therefrom, in accordance with a preferred embodiment of the invention.

FIG. 12 shows details of the construction of Filter A of FIG. 11 to detect an ex=±{1} error pattern event.

FIG. 13 shows details of the construction of Filter B of FIG. 11 to detect an ex=±{1,-1} error pattern event.

In the various figures of the drawing, like reference numerals are used to denote like or similar parts.

DETAILED DESCRIPTION OF THE PREFERRED EMBODIMENTS

Figures 1, 2:
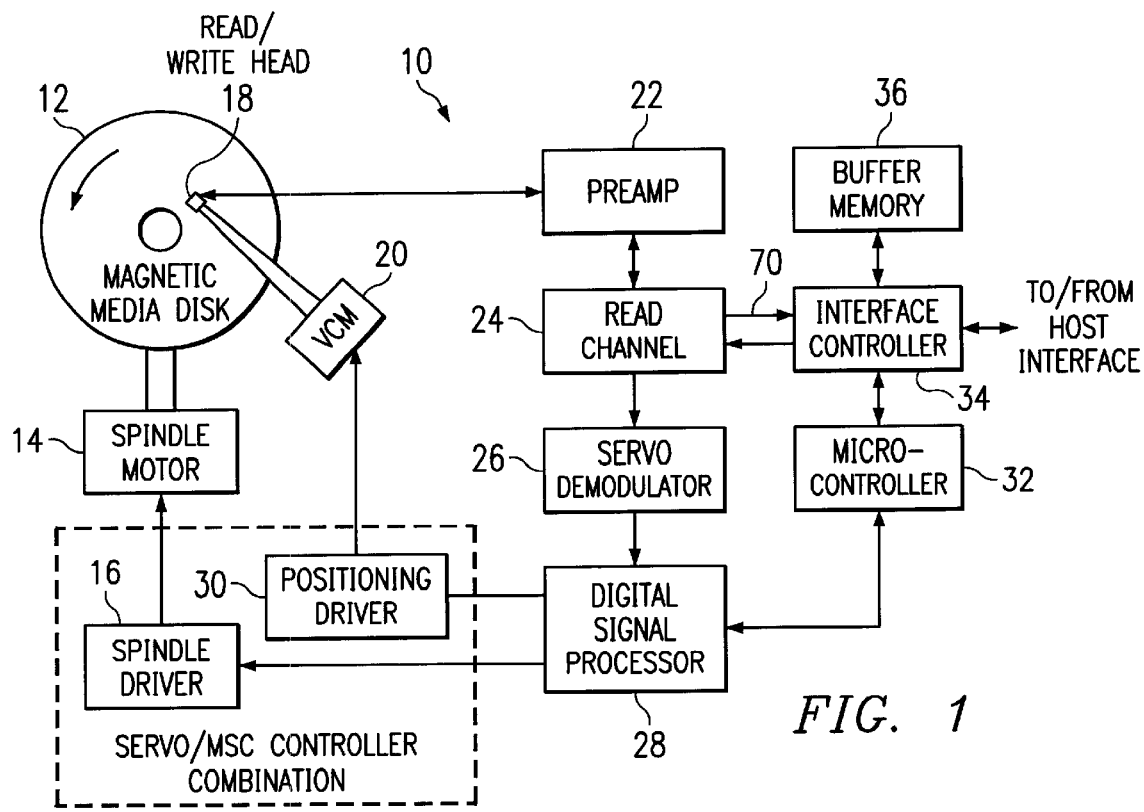
FIG. 1 is a block diagram of a disk drive system, which represents the general environment in which the invention may be practiced.
FIG. 2 shows a table showing error event patterns for a data stream model containing 100% Additive White Gaussian Noise (AWGN).

A block diagram of a disk drive system 10, representing the general environment in which the invention may be practiced, is shown FIG. 1. The system 10 includes a magnetic media disk 12 that is rotated by a spindle motor 14 and spindle driver circuit 16. A data transducer or head 18 is locatable along selectable radial tracks (not shown) of the disk 12 by a voice coil motor 20. The radial tracks may contain magnetic states that contain information about the tracks, such as track identification data, sector identification information, synchronization data, user data, and so forth. The head 18 is used to record user data to and read user data and other signals from the disk 12.

Analog electrical signals that are generated by the head 18 in response to the magnetic signals recorded on the disk are preamplified by a preamplifier 22 for delivery to read channel circuitry 24. The read channel 24 may contain circuitry for encoding and decoding data, inserting and recovering parity information, and performing post-processing operations, according to a preferred embodiment of the invention. Servo signals are detected and demodulated by one or more servo demodulator circuits 26 and processed by a digital signal processor (DSP) 28 to control the position of the head 18 via a positioning driver circuit 30.

A microcontroller 32 is typically provided to control the DSP 28, as well as an interface controller 34, to enable data to be passed to and from the host interface (not shown) in known manner. A data or buffer memory 36 may be provided, if desired, to buffer data being written to and read from the disk 12.

This invention has at least two broad aspects. The first aspect is the recognition that parity codes can be employed with maximum transition runlength (MTR) code constraints. In a preferred embodiment, the MTR code constraint is 16/17 MTR(3:11); however, those skilled in the art will appreciate that other MTR code constraints can be equally advantageously employed with appropriate modifications to the circuit design and the techniques employed therewith. In the 16/17 MTR (3:11) code constraint specification, the 16/17 represents the code rate, the 3 represents the maximum number of consecutive permitted transitions, and the 11 represents the maximum number of bit positions where no transition occurs.

The second aspect of this invention is the use of a post-processor and post-processing techniques to perform error correction of the data when an error is indicated by a parity code violation. We have found that by processing parity information in the post-processor, and moreover including MTR coding techniques, that the bit error rate can be significantly reduced.

However, it is noted that the inclusion of parity bit codes in data that has an MTR code constraint requires special considerations due to the length constraints of transitions that are allowed. For example, since a 16/17 MTR(3:11) constrained code constrains the maximum number of consecutive transitions to 3, and the maximum number of bit positions where no transition occurs to 11, it is permitted to have a run length limited code that has a first word with its final two positions that represent consecutive transitions. It is also possible to have a second word with its first two positions that indicate two consecutive transitions. When the words are concatenated, a code violation will occur. Thus in the past, when bit patterns occur in word endings and beginnings that may result in an MTR code constraint violation, code substitutions are generally made. This is discussed below in detail.

Moreover, the inclusion of parity bits between the two end points of consecutive words also can create a code constraint violation. Consequently, we have defined the parity bits to include 3 bit positions, an "even parity" bit, a "pad" bit, and an "odd parity" bit. The pad bit is located between the "even" and "odd" parity bits. It should be noted that the terms that "even parity" and "odd parity" are not used in the classical sense. Rather even parity refers to the parity of even numbered bits, and odd parity refers to the parity of odd numbered bits in the preceding word with which the parity bits are associated. The parity calculation, however, is classical even parity with both the even and odd bit groups. That is, the sum of all the even bits and their parity bit is 0, and the sum of the odd bits and their parity bit is 0.

By employing the "even parity" and "odd parity" bits, in the sense described immediately above, errors can be detected that would otherwise be undetectable using a classical parity bit. For example, error flips of two consecutive bits in a word can be detected. A classical parity calculation could not detect the flipped bits, since the parity sum would remain the same after the error. On the other hand, the two-bit error will flip one even numbered bit and one odd numbered bit, and will cause both the even parity bit and the odd parity bit to fail using the parity according to the invention.

The pad bit is located between the even and odd parity bits, and is always defined as a "1" if the last bit position of the preceding word is "0" and the first position of a subsequent next subsequent word is also "0". Otherwise, the pad bit is defined as a "0". Thus, no run length limited code violation will occur if either the last two positions of a preceding word are "1", nor will a violation occur if the first two bit positions of a next subsequent word are "1".

As will become apparent, the data errors that occur in the read back data that are to be corrected, according to the method and circuitry of the present invention, are identified by error type, then ranked by error events most likely to occur. A table showing error event patterns for a data stream model containing 100% Additive White Gaussian Noise (AWGN) is shown in FIG. 2, to which reference is now additionally made. For a 16/17 (0,6/8) code, the error event having the largest frequency of occurrence is the ex=±{1,-1,1} error pattern, which accounts for 68.6% of all of the errors. The next most likely error pattern is ex=±{1,-1,1,-1,1}, which accounts for 10.4% of all of the pattern event errors. This error event, however, cannot occur when the MTR(3:11) code constraint is applied, since the error, event requires 5 consecutive transitions, which is prohibited by the MTR(3:11) code constraint. (The same is true of the ex=±{1,-1,1,-1,1,-1} and ex=±{1,-1,1,-1,1,-1,1} error patterns. Although these account for only a very small percentage of error pattern occurrences, they are prohibited by the MTR(3:11) code constraint, and cannot occur.) In the 16/17 MTR(3:11) code, 98.4% of the errors occur in only 3 patterns: the ex=±{1}, ex=±{1,-1}, and ex=±{1,-1,1} events.

A similar analysis can be preformed for a model using 100% media noise, as shown in FIG. 3, to which reference is now additionally made. More particularly, in a 16/17 (0,6/8) code, the major error event contributors are the ex=±{1}, ex=±{1,-1}, and ex=±{1,-1,1} events, which account for 68.6% of all of the error events. It should be noted that the additionally listed error events require four or more consecutive transitions, which are prohibited by the MTR(3:11) code constraint. Thus, addressing the three listed error event patterns will result in a significant reduction in the bit error rate. Moreover, it can be seen that error events which are characterized by ex=±{1,0,1} and ex=±{1,0,0,1} events will reduce the number of bit error rates very close to zero. When a 16/17 MTR (3:11) code is used, the ex=±{1}, ex=±{1,-1}, and ex=±{1,-1,1} events account for 99% of all errors.

A table showing an example of the resulting parity bits for each of the listed error patterns for which the present invention is preferably designed is shown in the table of FIG. 4, to which reference is now additionally made. It should be noted that the data set shown in each row of the table of FIG. 4 is only a single example of data pattern errors that may occur from the original write current for the particular error patters with which they are associated.

Thus, for instance, the first error pattern that is considered is ex=±{1}. In this example, the error can be seen occurring in bit column 9, in which a write current of "1" is erroneously detected as a "0". The "0" results in an odd parity bit being erroneously reported as a "0". (As can be seen in the $1^{st}$ row, the correct parity bit should be reported as odd=1, even=1).

Similarly, a error pattern of ex=±{1,-1} results in data errors in the sensed write current columns 9 and 10 being detected as a "0","1", rather than "1","0" contained in the original write current. This results in the parity being reported as odd=0, even=0, which is clearly distinguishable from the original write current parity of odd=1, even=1. With respect to the error pattern ex=±{1,-1,1}, it can be seen that in FIG. 4 the bit patterns in columns 9, 10, and 11 differ from the original write current. This results in the parity bits being developed that are odd=1, even=0, which, again, are distinguishable from the parity of the original write current.

With respect to the error pattern ex=±{1,0,1} which is evidenced by the values in columns 9 and 11 being different from the original write current, it is noted that the parity pattern that is developed is the same as the original parity pattern. However, it is also noted from the tables of FIGS.

2 and 3 that the error pattern ex=±{1,0,1} has an extremely low incidence of occurrence (0.0% and 0.4%, respectively), and, therefor, it is very unlikely to occur.

The error pattern ex=±{1,0,0,1} results in error bits occurring in columns 9 and 12, which produces a clearly detectible parity bit pattern that differs both in odd and even bits from the parity of the original write current.

Figure 5A:
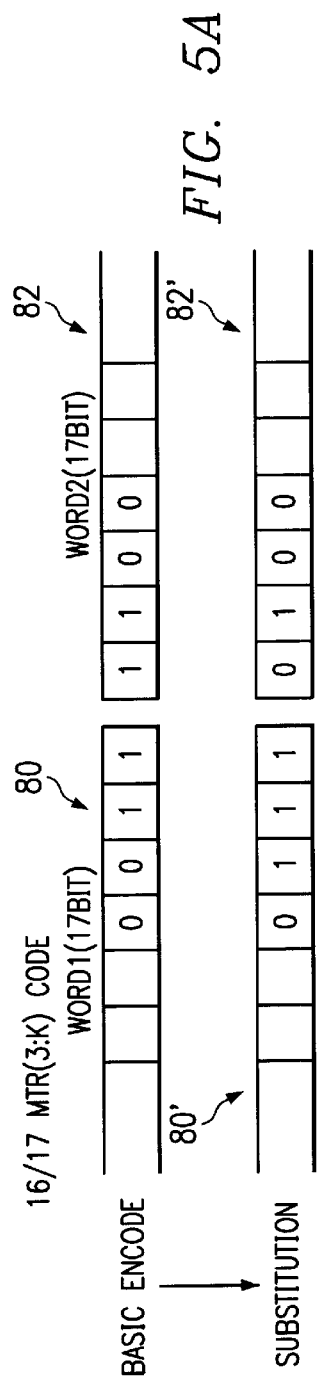
FIG. 5A shows one way of substituting codes at word ends and beginnings for certain data patterns so that MTR code constraint violations do not occur when the words are concatenated.
Figure 5B:
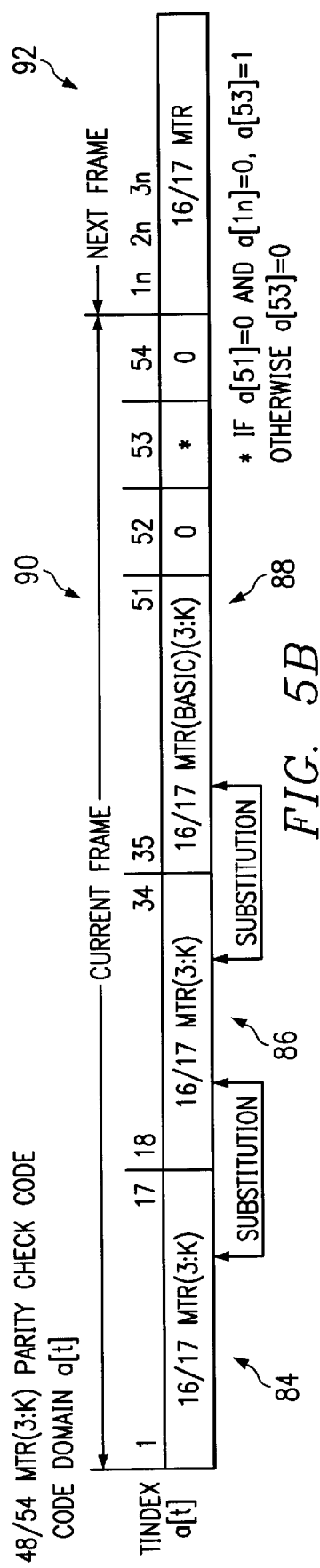
FIG. 5B shows an example of parity bit insertion into a data stream, according to a preferred embodiment of the invention.
Figure 5C:
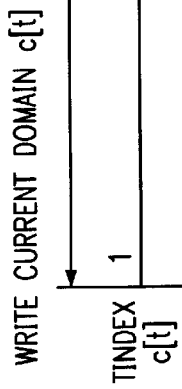
FIG. 5c shown a write current domain diagram of a data frame shown in FIG. 5B, illustrating how the parity bits are concatenated to a 51 bit word formed from three concatenated 17-bit words.

As an example of the manner in which the parity code is added to the data to be written to the disk, reference is now additionally made to FIGS. 5A–C, which illustrate a 16/17 MTR(3:k) code constraint. With reference first to FIG. 5A, two consecutive 17 bit words 80 and 82 are shown as they would ordinarily be transmitted or written to the disk or recording media.

Due to the MTR(3:k) code constraint that is employed, certain bit patterns at the end and beginning of each of the basic encoded words must be avoided in order to enable a parity bit pattern to be inserted between the words. For example, one of such possible patterns is illustrated in FIG. 5A, in which the last four bits of word 80 are "0011"and the first four bits of the following word 82 are "1100". Although the bit patterns themselves with respect to each word do not result in a code violation, when the words are concatenated, four consecutive transitions result, which is a violation of the MTR(3:k) code.

Ordinarily, therefor, when this particular data pattern (0011+1100) appears, a substitution is made, as shown in the lower two words 80' and 82' when the data is encoded. Thus, the final bit pattern of the word 80' is substituted with "0111" and the initial bit pattern of word 82' is substituted with "0100". Thus, when the words are concatenated, no code violation occurs. As is known, other ending/beginning word combinations that may cause code violations also exist, examples of which may be seen in Nishiya, et al., "Turbo-EEPRML: An EEPR4 channel with an Error-Correcting Post-Processor Designed for 16/17 MTR Rate Quasi-MTR Code", Proc. of GLOBECOM '98, pp. 2706–2711, 1998, incorporated herein by reference.

Consequently, in order to insert the parity bits.into the word stream, according to a preferred embodiment of the invention, several changes must be made in the manner in which the words are processed. These are shown in FIG. 5B, to which reference is now additionally made. As shown, three 17-bit words 84, 86, and 88 are concatenated into a 51-bit word. At the end of the 51-bit word, three parity bit positions 52, 53, and 54 are added, so that the entire concatenation of words 84, 86, 88 and the parity bits form a 54-bit data frame 90. A following frame 92 is similarly formed, and so forth.

With respect to the concatenation of the first and second 17-bit words 84 and 86, a word substitution may be made in the last four bits of word 84 and the first four bits of word 86, if an illegal code word combination would result from the concatenation, as described above with reference to FIG. 5A. Similarly, if the last four bits of word 86 and the first four bits of word 88 would combine to form an illegal code word combination, a substitution may be made, again, in the manner described with reference to FIG. 5A. However, with the insertion of the parity bits in bit positions 52, 53, and 54 of the frame, no illegal code word substitution is made in the concatenation of frame 90 with the subsequent frame 92. Instead, the parity bits are written into the bit positions 52, 53, and 54, with precautionary modifications to prevent an inadvertent code violation, as described below in detail.

The values of the parity bits that inserted into bit positions 52 and 54 are the "even parity" and "odd parity" values that are determined in the manner described above with reference to FIG. 4. Thus, in providing the parity bits in bit positions 52 and 54 of the frame 90, the even parity bit is placed into bit position 52 and the odd parity bit is placed into bit position 54.

As mentioned, the center bit 53 is used to receive a "pad" bit. The pad bit is provided to enable values to be included that will prevent inadvertent MTR code violations by virtue of the inclusion of the parity bit information. Ordinarily, for example, the pad bit will be of value "0". However, if the value in bit position 51 of the first frame 90 is "0" and also the first bit position in the subsequent frame 92 is "0", it can be seen that a possible non-transition code violation may occur, depending upon the number of preceding or succeeding zeros and the values of the even an odd parity bits in bit positions 52 and 54. Thus, if the value of the pad bit is "0" and the combination of values in the end part of frame 90 and the first part of 92 are also "0" to form a series of "0"s sufficiently long to violate the "k" of the MTR(3:k) code, (a QMTR code) a code violation may occur. Consequently, when the value in bit position 51 of frame 90 is "0" and the value in bit position 1n of frame 92 is "0", the pad bit located in bit position 53 of frame 90 is set to "1". This will insure that a transition occurs to prevent a nontransition code violation from occurring.

Still more particularly, user data is encoded to a binary NRZ format with a MTR(3:k) constraint that disallows four "1" bits in succession, and is subsequently converted to an NRZI format using a precoder with a 1/(1+D) polynomial. In the NRZI format, each "1" is represented by a transition. The MTR(3:k) constraint in the NRZ domain disallows four successive "1" bits, and in the NRZI domain, four successive transitions are disallowed. (In an NRZ code a "1" is represented by a high value, and a "0" is represented by a low value. In an NRZI code, a "1" is represented by a transition, either from 1 to zero or from zero to 1.)

The pad bit is calculated in the NRZ domain, before precoding. As mentioned, the MTR(3:k) code allows only two transitions to occur at the end of one code word or the beginning of the next code word. Thus, as shown in Table 1, the sequence $\{x_{KM-2}, x_{KM-1}, x^{KM}\}$ will not be $\{1, 1, 1\}$, and $\{x_1, x_2, x_3\}$ will not be $\{1, 1, 1\}$.

TABLE 1

| | | | | | | | | | |
|---|---|---|---|---|---|---|---|---|---|
| Parity and pad bits inserted between QMTR code words ||||||||||
| Frame Position | N-5 | NA | N-3 | N-2 | N-1 | N | 1 | 2 | 3 |
| Description | Data | Data | Data | Even Parity | Pad | Odd Parity | Data | Data | Data |
| | Code Word K ||| Pad/Parity ||| Code Word 1 |||
| Bit Name | $x_{KM-2}$ | $x_{KM-1}$ | $x_{KM}$ | $P_{even}$ | $P_{pad}$ | $P_{odd}$ | $x_1$ | $x_2$ | $x_3$ |

If the parity bits are inserted with no intervening pad bit, then a MTR(3:k) violation could occur with as many as six successive 1 bits. To prevent this, a pad bit is added between the two parity bits. The pad bit is set as shown in Table 2.

TABLE 2

Pad bit value

| Condition | | Pad Bit Value |
|---|---|---|
| $x_{KM}$ | $x_1$ | |
| 1 | x | 0 |
| x | 1 | 0 |
| 0 | 0 | 1 |

The parity bits are calculated in the NRZI domain, after the data has been precoded. The parity bits are inserted, unprecoded, into the NRZI data stream. The result of the preceding operation around the frame boundary is shown in Table 3.

TABLE 3

Precoded data with inserted parity and bits

| Frame Position | N4 | N-3 | N-2 | N-1 | N | 1 |
|---|---|---|---|---|---|---|
| Description | Data | Data | Even Parity | Pad | Odd Parity | Data |
| NRZ Value prior to precoder ($x_i$) | $x_{KM-1}$ | $x_{KM}$ | $P_{even}$ | $P_{pad}$ | $P_{odd}$ | $x_1$ |
| NRZI Value after precoder ($y_i$) | $y_{N-4} = y_{N-5} \oplus x_{KM-1}$ | $y_{N-3} = y_{N-4} \oplus x_{KM}$ | $y_{N-2} = P_{even}$ | $y_{N-1} = P_{even} \oplus P_{pad}$ | $y_N = P_{odd}$ | $y_1 = P_{odd} \oplus x_1$ |

The write current domain diagram of a frame 94 is shown in FIG. 5C, to which reference is now additionally made. Again, the parity bits are concatenated to a 51-bit word, which, itself, may represent three concatenated 17-bit words, to form a 54-bit frame. Parity information that is located in bit position 52 represents the parity of each of the even bits C2, C4, C6, C8, . . . C50. On the other hand, the parity information that is located in bit position 54 of frame 94 represents the parity of the odd bits 1, 3, 5, 7, . . . 53. Information in bit position 53 is the pad bit, described above.

Each of the bit positions in frame 92 can be determined by decoding the data of the code domain of FIG. 5B with the data received in the write current domain.

After the data is read back and detected, the NRZI data is postcoder using a 1+D polynomial to recover the original data. The result of postcoding is shown in Table 4. Although the original data and pad bits, are reproduced correctly, the even and odd parity bits are not reproduced correctly after the postcoder, but parity checking is performed on the NRZI data, before postcoding, so the parity bits are not needed after the postcoder.

TABLE 4

Postcoded data

| Frame Position | N-4 | N-3 | N-2 | N-1 | N | 1 |
|---|---|---|---|---|---|---|
| Description | Data | Data | Even Parity | Pad | Odd Parity | Data |
| NRZI Value prior to postcoder ($y_i$) | $y_{N-4} = y_{N5} \oplus D_{M-1}$ | $y_{N-3} = y_{N-4} \oplus D_M$ | $y_{N-2} = P_{even}$ | $y_{N-1} = P_{even} \oplus P_{pad}$ | $y_N = P_{odd}$ | $y_1 = P_{odd} \oplus D_1$ |
| Recovered NRZ Value after postcoder ($x_i$) | $y_{N-4} \oplus y_{n-5} = x_{KM-1}$ | $y_{N-3} \oplus y_{N-4} = x_{KM}$ | $y_{N-2} \oplus y_{N-3} = XX$ | $y_{N-1} \oplus y_{N-2} = P_{pad}$ | $y_N \oplus y_{N-1} = XX$ | $y_1 \oplus y_N = x_1$ |

XX = Unknown

Error propagation through the postcoder is shown in Table 5. One bit errors at the pad bit location cause an odd parity error, and are detected and corrected by the post-processor. However, two bit and three bit errors beginning at the pad bit location cause the pad bit and the odd parity bit to both be inverted, canceling the parity error. A three bit error at the pad bit location will also cause the first bit of the next frame to be inverted.

TABLE 5

Error propagation through the postcoder

Normal data sequence before (y) and after (x) $1 \oplus D$ postcoder

| y | $y_{j-1}$ | $y_j$ | $y_{j+1}$ | $y_{j+2}$ | $y_{j+3}$ | $y_{j+4}$ |
|---|---|---|---|---|---|---|
| x | $x_{j-1} = y_{j-1} \oplus y_{j-2}$ | $x_j = y_j \oplus y_{j-1}$ | $x_{j+1} = y_{j+1} \oplus y_j$ | $x_{j+2} = y_{j+2} \oplus y_{j+1}$ | $x_{j+3} = y_{j+3} \oplus y_{j+2}$ | $x_{j+4} = y_{j+4} \oplus y_{j+3}$ |

Sequence with 1 bit error before postcoding beginning at position j, before (y') and after (x') $1 \oplus D$ postcoder.

| y' | $y_{j-1}$ | $\overline{y_j}$ | $y_{j+1}$ | $y_{j+2}$ | $y_{j+3}$ | $y_{j+4}$ |
|---|---|---|---|---|---|---|
| x' | $x'_{j-1} = y_{j-1} \oplus y_{j-2} = x_{j-1}$ | $x'_j = \overline{y_j} \oplus y_{j-1} = \overline{y_j \oplus y_{j-1}} = \overline{x_j}$ | $x'_{j+1} = y_{j+1} \oplus \overline{y_j} = \overline{y_{j+1} \oplus y_j} = \overline{x_{j+1}}$ | $x'_{j+2} = y_{j+2} \oplus y_{j+1} = x_{j+2}$ | $x'_{j+3} = y_{j+3} \oplus y_{j+2} = x_{j+3}$ | $x'_{j+4} = y_{j+4} \oplus y_{j+3} = x_{j+4}$ |

TABLE 5-continued

Error propagation through the postcoder

Sequence with 2 bit error (before postcoding) beginning at position j, before (y') and after (x') $1 \oplus D$ postcoder.

| y' | $y_{j-1}$ | $\overline{y_j} =$ | $\overline{y_{j+1}} =$ | $y_{j+2}$ | $y_{j+3} =$ | $y_{j+4} =$ |
|---|---|---|---|---|---|---|
| x' | $x'_{j-1} =$ | $\overline{x'_j} =$ | $\overline{x'_{j+1}} =$ | $x'_{j+2} =$ | $x'_{j+3} =$ | $x'_{j+4} =$ |
| | $y_{j-1} \oplus y_{j-2} =$ | $\overline{y_j \oplus y_{j-1}} =$ | $y_{j+1} \oplus \overline{y_j} =$ | $\overline{y_{j+2} \oplus y_{j+1}} =$ | $y_{j+3} \oplus y_{j+2} =$ | $y_{j+4} \oplus y_{j+3} =$ |
| | $x_{j-1}$ | $\overline{y_j \oplus y_{j-1}} = \overline{x_j}$ | $y_{j+1} \oplus y_j =$ | $\overline{y_{j+2} \oplus y_{j+1}} =$ | $x_{j+3}$ | $x_{j+4}$ |
| | | | $x_{j+1}$ | $x_{j+2}$ | | |

Sequence with 3 bit error (before postcoding) beginning at position j, before (y') and after (x') $1 \oplus D$ postcoder.

| y' | $y_{j-1}$ | $\overline{y_j} =$ | $\overline{y_{j+1}} =$ | $\overline{y_{j+2}} =$ | $y_{j+3} =$ | $y_{j+4} =$ |
|---|---|---|---|---|---|---|
| x' | $x'_{j-1} =$ | $\overline{x'_j} =$ | $\overline{x'_{j+1}} =$ | $\overline{x'_{j+2}} =$ | $x'_{j+3} =$ | $x'_{j+4} =$ |
| | $y_{j-1} \oplus y_{j-2} = x_{j-1}$ | $\overline{y_j \oplus y_{j-1}} =$ | $y_{j+1} \oplus \overline{y_j} =$ | $\overline{y_{j+2} \oplus y_{j+1}} =$ | $y_{j+3} \oplus \overline{y_{j+2}} =$ | $y_{j+4} \oplus y_{j+3} = x_{j+4}$ |
| | | $\overline{y_j \oplus y_{j-1}} = \overline{x_j}$ | $y_{j+1} \oplus y_j = x_{j+1}$ | $y_{j+2} \oplus y_{j+1} = x_{j+2}$ | $\overline{y_{j+3} \oplus y_{j+2}} = \overline{x_{j+3}}$ | |

Referring to Table 5, if a 2-bit error occurs at frame position N−1, then bits N−1 and N will be inverted in the NRZI domain. No parity error will be found in the current frame or the next frame. After postcoding, bit N in the current frame will be restored, and bit 1 of the next frame will be inverted. Because the error in the current frame was limited to the pad bit and the odd parity bit, there will be no decoder errors in the current frame. In the next frame, the error at bit 1 will cause the first code word to be decoded incorrectly.

A 3-bit error beginning at the pad location will cause NRZI bits N−1 and N in the current frame, and bit 1 in the next frame, to be inverted. No parity error will be found in the current frame, but the next frame will have an odd parity error due to the error at bit 1 in the next frame. After postcoding, bit N−1 in the current frame and bit 2 in the next frame will be inverted. Even though an odd parity error is detected in the next frame, the post-processor will not report the error correctly, since it began in the current frame.

As mentioned, the pad bit is generated in the NRZ domain, before conversion to NRZI in the precoder. After detection and postcoding, the detected pad bit can be checked by comparing it to the calculated value, $P''_{pad}$, using the same equation that was used to generate the original pad bit: $P''_{pad} = \overline{x'_{KM} + x'_1}$. If there is a difference between P'pad and P''pad, then a pad error occurred. The pad error check will accurately detect pad bit errors that result from all three bit errors and half of the two bit errors that begin at the pad bit location. Tables 6a and 6b summarize the results.

TABLE 6a

Two bit pad error check results

| Encoded NRZ, prior to precoder | | | Detected NRZ, after postcoder | | | $P''_{pad}$ | Pad Error Detected |
|---|---|---|---|---|---|---|---|
| $x_{KM}$ | $x_1$ | $P_{pad}$ | $x'_{KM}$ | $x'_1$ | $P'_{pad}$ | $\overline{x'_{KM} + x'_1}$ | $P'_{pad} \neq P''_{pad}$ |
| 0 | 0 | 1 | 0 | 1 | 0 | 0 | No |
| 0 | 1 | 0 | 0 | 0 | 1 | 1 | No |
| 1 | 0 | 0 | 1 | 1 | 1 | 0 | Yes |
| 1 | 1 | 0 | 1 | 0 | 1 | 0 | Yes |

TABLE 6b

Three bit pad error check results

| Encoded NRZ, prior to precoder | | | Detected NRZ, after postcoder | | | $P''_{pad}$ | Pad Error Detected |
|---|---|---|---|---|---|---|---|
| $x_{KM}$ | $x_1$ | $P_{pad}$ | $x'_{KM}$ | $x'_1$ | $P'_{pad}$ | $\overline{x'_{KM} + x'_1}$ | $P'_{pad} \neq P''_{pad}$ |
| 0 | 0 | 1 | 0 | 0 | 0 | 1 | Yes |
| 0 | 1 | 0 | 0 | 1 | 1 | 0 | Yes |
| 1 | 0 | 0 | 1 | 0 | 1 | 0 | Yes |
| 1 | 1 | 0 | 1 | 1 | 1 | 0 | Yes |

Pad errors may also result from errors in the x'KM and x'1 data bits. To prevent corrections in these cases, the post-processor contains a pad error max detect block, which looks at the outputs of the two bit and three bit matched filters at the pad bit location. A pad error correction will only be made if a pad error is detected and the maximum value detectors finds a matched filter output at the pad bit location that exceeds the threshold value.

A block diagram of a PRML read channel 24 for a magnetic recording device, such as a hard disk drive, or the like, incorporating a post-processor and parity error data correction facility according to the invention is shown in FIG. 6, to which reference is now additionally made. The read channel circuitry 24 receives data from the interface controller 34. An encoder circuit 42 encodes the data, for example, with an appropriate MTR code, which may be, for example, a 16/17 MTR(3:11) code, or other appropriate code., The encoded data with appended parity bits is provided on an output line 44 to a write flip-flop/parity insertion circuit 46 to record the data onto the magnetic media disk 12 via the head 18. The circuit 42 additionally generates and inserts the even and odd parity bits, together with the pad bit into the encoded data stream as described above.

The data to be read back, is read from the disk 12 by the head 18 and preamplified by a preamplifier circuit 48. The preamplified signal is equalized for a partial response target, for example, an EPR4 target by an EPR4 equalizer circuit 50. The equalizer circuit 50 includes an analog continuous-time filter 52, which provides an output that is digitized by an analog-to-digital (A/D) converter 54. To complete any equalization requirements, a digital FIR filter 56 is provided to provide an EPR4 analyzed target signal on the output line 58.

Equalized data on line 58 is conditioned by a noise predictive filter 60 and detected by a Viterbi detector 62. The output from the Viterbi detector 62 on line 64 and the output from the FIR filter 56 on line 58 are connected to a post-processor 66. In addition, the output from the Viterbi detector 62 is also connected to a parity decoder 63, which provides parity information to the post-processor 66. The post-processor, as below described, corrects the data that is provided at the output of the Viterbi detector 62 in accordance with detected parity code data. The output from the post-processor 66 is provided to a decoder circuit 68, which provides an output on line 70 to the interface controller 34 (see FIG. 1).

The sequence in which the parity bits are inserted into the data stream and subsequently decoded therefrom is illustrated in the block-diagram of FIG. 7. As shown by the dotted block 42, during the write process, data from the interface controller. 24 is encoded 200, as described above, in an NRZ coding format. The encoded data is then used in the determination of a pad bit 202. The calculation of the pad bit is performed such that the value of the pad bit that is inserted between the even and odd parity bits avoids any MTR code constraint violations, as described above. The data stream is then precoded in a precoder circuit 204, described below in detail, which codes the data to the NRZI coding format. (A postcoder with a 1+D polynomial, described below in detail, is used to convert the NRZI data to NRZ on readback.) The even and odd parity bits are then generated and inserted into the data stream, as denoted by box 206 to be written to the head/media 12, 18.

The parity detection is accomplished on readback by the parity decoder 63, which detects the signals read from the media 12 by the head 18, for example, in a detector circuit 208, which may, for example, include equalization, filtering, and Viterbi detection functions described above. An even and odd parity bit check is performed, box 210, and the signal postcoder by a postcoder circuit 212. The pad bit is then checked in a pad bit checker 214, and the parity bits and pad bit are decoded in a decoder 216 to be provided to the post-processor 66.

Figure 8:
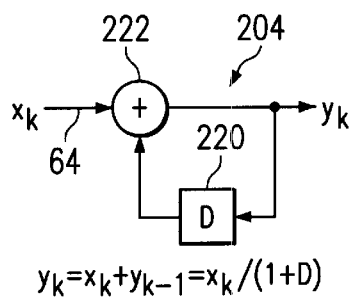
FIG. 8 shows an electrical schematic diagram of a precoder circuit, which can be used in conjunction with the write path of FIG. 7, in accordance with a preferred embodiment of the invention.

FIG. 8, to which reference is now additionally made, is an electrical schematic diagram of a precoder circuit 204, which can be used in conjunction with the write path 42 described above. The precoder 204 receives input signal $X_K$ at the output of the Viterbi detector 62, and sums it with a delay operator 220. The delay operator 222 delays the output from the summer circuit 222 and adds it back to the input signal to produce the output signal $Y_K$. It can be seen, therefore, that the output signal $Y_K$ equals $X_K + Y_{(K-1)}$, which equals $X_K/(1+D)$.

Figure 9:
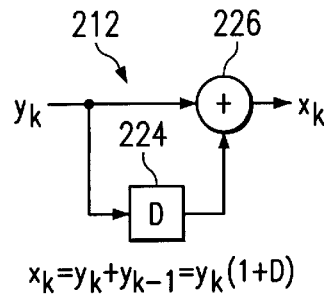
FIG. 9 shows a postcoder circuit that may be used in the read path of FIG. 7, in accordance with a preferred embodiment of the invention.

The postcoder circuit 212 used in the read path of FIG. 7 is shown in FIG. 9, to which reference is now additionally made. The postcoder 212, in essence, reverses the process applied by the precoder 204. Thus, the signal $Y_K$ is delayed by a delay operator 224 and summed with the current input value in a summer 226 to recreate the original $X_K$ signal output. Therefore, the operation performed by the post coder 212 is $X_K = Y_K + Y_{(K-1)} = Y_K(1+D)$.

Figure 10A:
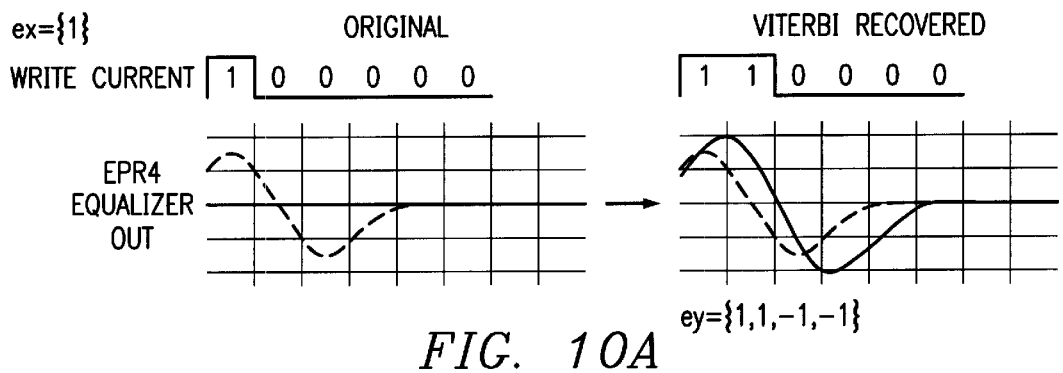
FIGS. 10A–C show examples of error events that may be specifically addressed by the post-processor, in accordance with a preferred embodiment of the invention.
Figure 10B:
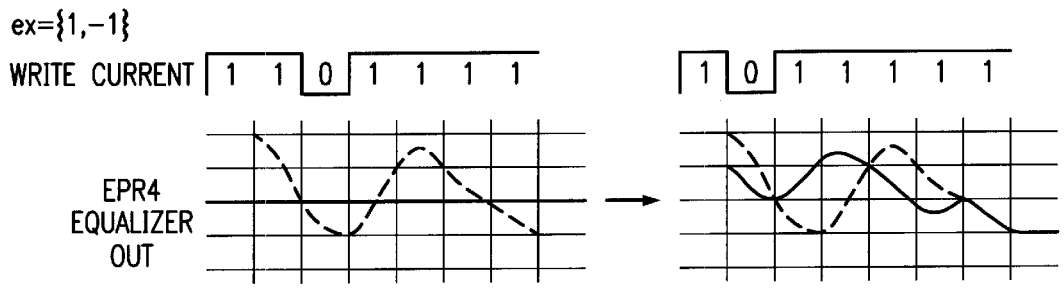
Figure 10C:
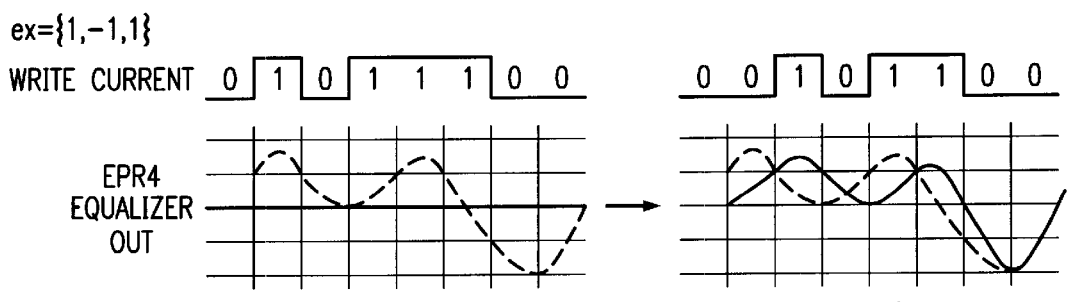

Examples of error events that are specifically addressed by the preferred embodiment of the post-processor of the invention are shown in FIGS. 10A–C, to which reference is now additionally made. Thus, the original write current is shown on the graphs on the left, and the Viterbi recovered signal is shown on the graphs on the right, having in FIGS. 10A–C respective errors ex=±{1}, ex=±{1,-1}, and ex=±{1,-1,1}.

Figure 11:
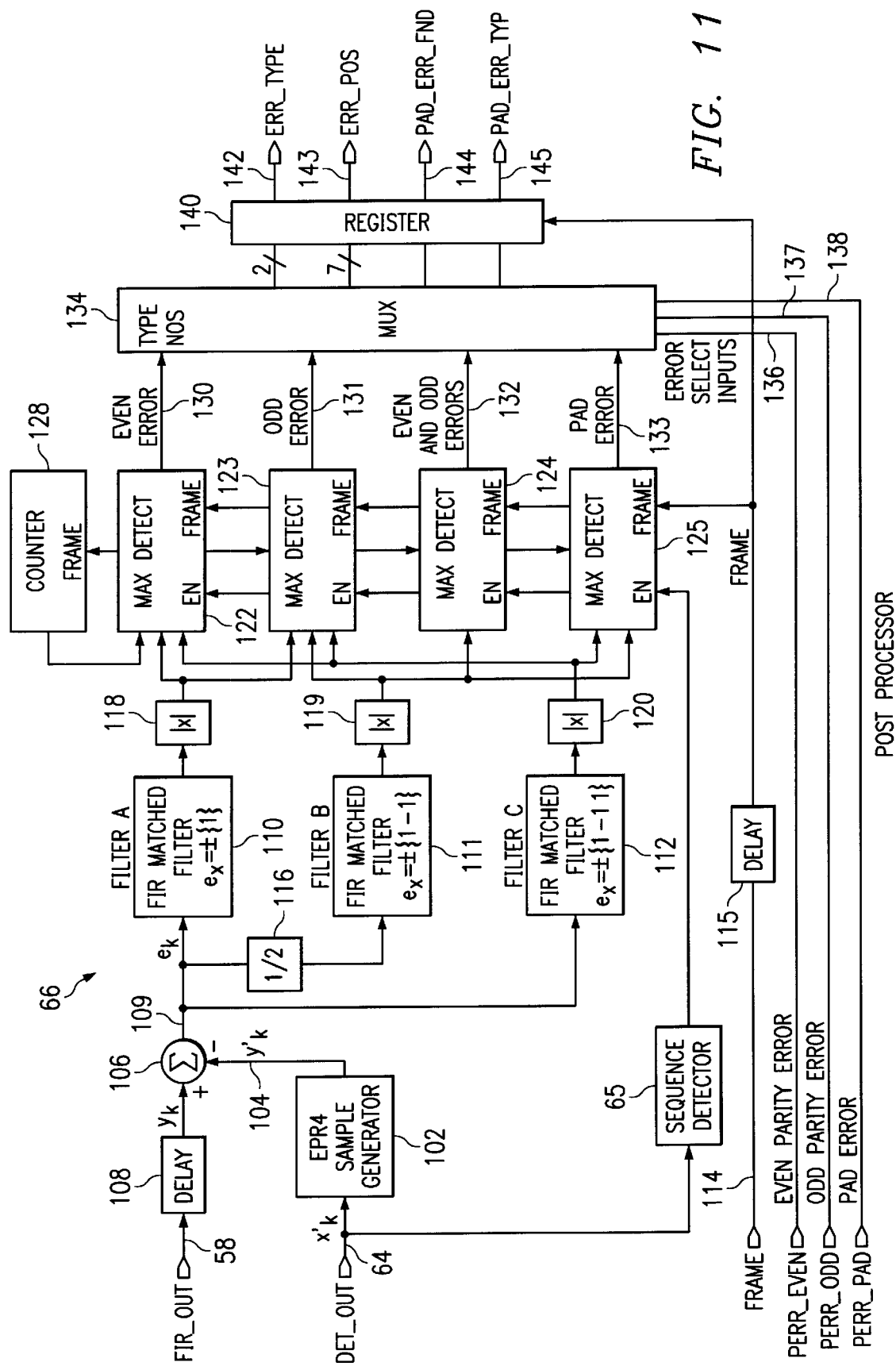
FIG. 11 shows block diagram of a post-processor circuit, in accordance with a preferred embodiment of the invention.

In order to process the recovered data, according to a preferred embodiment of the invention, the post-processor circuit 66 is used, a block diagram of which is shown in FIG. 11, to which reference is now additionally made. The post-processor circuit 66 receives the output from the FIR filter 56 on line 58 and the output from the Viterbi detector 62 on line 64. In addition, the post-processor 66 receives the parity error signals on lines 136–138 from the parity decoder 216. Additionally, a frame signal is received on line 114 from a frame determining circuit (not shown).

An EPR4 sample generator 102 receives the signal on line 64 from the Viterbi detector, and generates an EPR4 signal $Y'_K$, which is an estimate of the FIR filter output received on line 58, on line 104. The EPR4 signal, $Y'_K$, is subtracted from the signal, $Y_K$, at the output of the FIR filter 58 by a summer 106. The signal on line 58 is delayed by a delay circuit 108 to be in proper phase with the EPR4 signal on line 104.

The output from the summer 106 is applied on line 109 to three filter circuits 110–112, which respectively determine the occurrence of possible error events, specifically, error events ex=±{1}, ex=±{1,-1}, and ex=±{1,-1,1}. As mentioned above, these three error event types represent the most likely error events to occur in the detected data stream. The input to the filter 112 is reduced by half by a divider circuit 116. The filter circuits 110–112 each operate to pass only the signal for which it is designed. When such signal is present, therefore, the output from the filter is maximum.

The absolute value of the outputs from the filters 110–112 are generated by absolute value generating circuits 118–120, respectively. The maximum values of the outputs of the filters 110–112, indicating the detection of an error event, are detected by maximum value detectors 122–125. Additionally, the outputs from the matched filters 110–112 are applied to the maximum value detectors on 122–125 in various combinations to produce at the outputs of the maximum value detectors 122–125 indications of even error, odd error, even and odd errors, and pad error on respective lines 130–133. Thus, for example, the absolute value of the output of the FIR matched filter 110 is applied to inputs of maximum value detectors 122 and 123. The absolute value of the FIR matched filter 111 is applied to inputs of maximum value detectors 123, 124, and 125. The absolute value of the FIR matched filter 112 is applied to the inputs of maximum value detectors 122, 123, and 125.

The detectors 122–125 are aligned with the data frames as they are produced by a counter circuit 128. The frame information provided on input line 114 is delayed by a delay element 115 to provide the frame alignment timing of the counter 128 and maximum signal detectors 122–125. The counter 128, which is reset by the delayed frame signal, enables the detectors to produce at their respective outputs even and odd error signals together with a pad error signal on respective output lines 130–132. The maximum value detectors 122 and 125 are enabled by the output signal from the Viterbi detector 62 on line 64, via a sequence detector 65.

Thus, it can be seen that when the error events that are defined by the filter coefficients of the filters 110–112 occur, the absolute value of the output of the respective filter produces a maximum signal level that is detected by one or more of the detectors 122–125. This produces an output on one of respective lines 130–132, which are connected to a multiplexer 134. The parity information that is recovered from the read back data is provided on input lines 136–138, which control the multiplexer 134 to select one of the respective lines 130–132, depending upon which parity error is detected.

The output from the multiplexer 134 is registered in a register 140 to provide correction information on output lines 142–145. The information provided on lines 142–145 respectively represents the error type, the error position, the pad error occurrence, and pad error type. The output information on lines 142–145 can then be used to correct the data information on line 64 at the output from the Viterbi detector to be provided to the decoder circuit 68.

Details of the FIR matched filter 110 are shown in FIG. 12, to which reference is additionally made. The filter 110, referred to herein as "Filter A", determines the presence of the error condition ex=±{1}. The input to the filter 110 on line 109 from the summer 106 represents the error signal developed between the outputs of the FIR filter on line 58 and the Viterbi detector on 64. As the data is sequentially clocked into the FIR matched filter 110, it is applied to successive delay elements, D, 300–306. The signal at each node in the filter is represented by characters e(9), e(8), e(7), e(6), e(5), e(4), e(3), and e(2).

The signals e(9) and e(2) at the first and last nodes are subtracted by a summer 310 and weighted by a multiplier 312 with a weighting value Ca4=0.5. Similarly, the signals e(8) and e(3) at the second and next to last nodes are subtracted by a summer 314 to develop an error value which is weighted by a multiplier circuit 316, with a weighting value of Ca3=0.5. The signals e(7) and e(4) at the third from the input and third from the output nodes are subtracted in a summer 318 and weighted by a multiplier 320 with a weight of CA2=1.0. Finally, the signals e(6) and e(5) at the fourth from the input and fourth from the output nodes are subtracted by a summer 322 and multiplied by a weighting factor of Ca1=0.5 in a multiplier circuit 324.

The weighted outputs from the multipliers 312, 316, 320, and 324 are summed in a summer circuit 326, and weighted with a value of 1/(2Ca1+2Ca2) to produce an output on line 328, referred to herein as fexA. The values Ca1 and Ca2 correspond to the weighting values applied at weighting circuits 312 and 316 of the filters 110.

The FIR filter 111, which determines the occurrence of the error event ex=±{1,-1}, referred to herein as "Filter B", is shown in FIG. 13. The filter 111, which also receives its input on line 109, includes a number of delay elements 330–337. The nodes between the input and output are respectively labeled e(8), e(7), . . . , e(0). The output signal e(5) from delay element 332 is weighted with a weight of Cb1=1.0 in a multiplier 340, and is subsequently multiplied by a factor 1/(2Cb1) in a multiplier 342 to produce an output on line 344 that is referred to herein as fexB. The value Cb1 corresponds to the weighting values applied at weighting circuits 340 of the filter 111.

Figure 14:
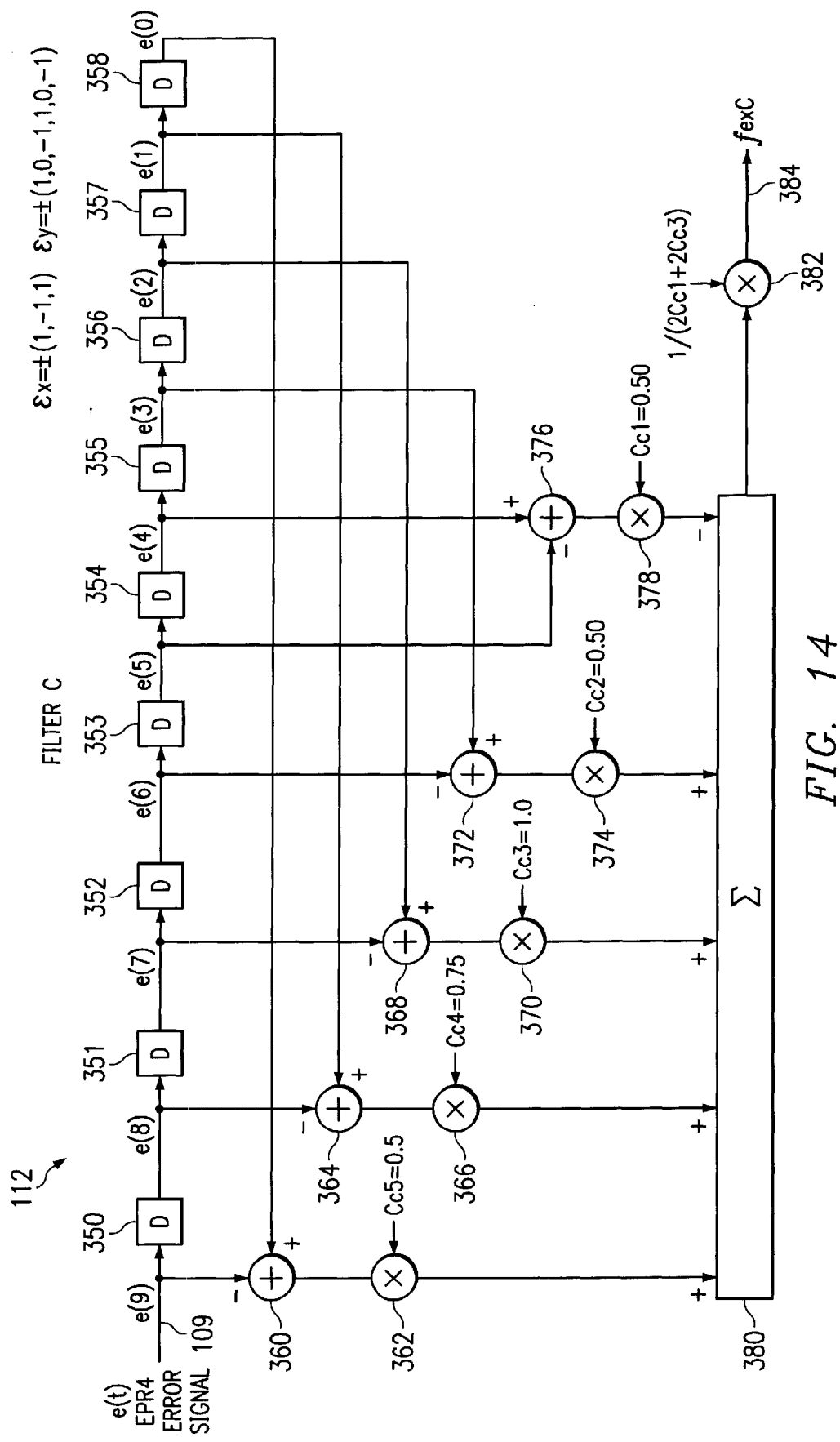
FIG. 14 shows details of the construction of Filter A of FIG. 11 to detect an ex=±{1,-1,1} error pattern event.

Details of the FIR matched filter 112, referred to herein as "Filter C", are shown in FIG. 14, to which reference is now additionally made. The input to the filter 112 on line 109 is applied to successive delay elements 350–358. The respective nodes between the input and the output are labeled e(9), e(8), . . . , e(0). The signals e(9) and e(0) at the input and output nodes are subtracted in a summer 360, and the error value determined thereby is weighted by a weight of Cc5=0.5 in a multiplier circuit 362. The signals e(8) and e(1) at nodes that are second from first and last are subtracted by a summer circuit 364 and weighted by a weight of Cc4=0.75 in a multiplier 366. The signals e(7) and e(2) at the third nodes from input and output are subtracted from each other in a summer 368, and are weighted by a weight of Cc3=1.0 by a multiplier circuit 370. The signals e(6) and e(3) at the nodes that are fourth from input and output are subtracted in a summer 372 and weighted with a weight of Cc2=0.50 by a multiplier circuit 374. The signals e(5) and e(4) at the nodes that are fifth from input and output are subtracted from each other in a summer 376 and weighted with a weight of Cc1=0.50 by a multiplier circuit 378.

The outputs from the weighted outputs from the multipliers 362, 366, 370, 374, 376, and 378 are summed in a summer circuit 380 (the sign at the output of the multiplier 378 being reversed). The output is multiplied by a multiplier 382 by a value of 1/(2Cc1+2Cc3) to produce an output on line 384, referred to here in as fexC. The values Cc1 and Cc3 correspond to the weighting values applied at the multipliers 362 and 370 of the filters 112.

It is noted that the various output values fexA, fexB, and fexC on lines 328, 344, and 384 represent streams of sequential data having maximum values that occur at time periods at which the error events determined by the respective filter occurs. The manner in which the various error events are corrected can be more fully appreciated with reference additionally to FIG. 15.

Figure 15:
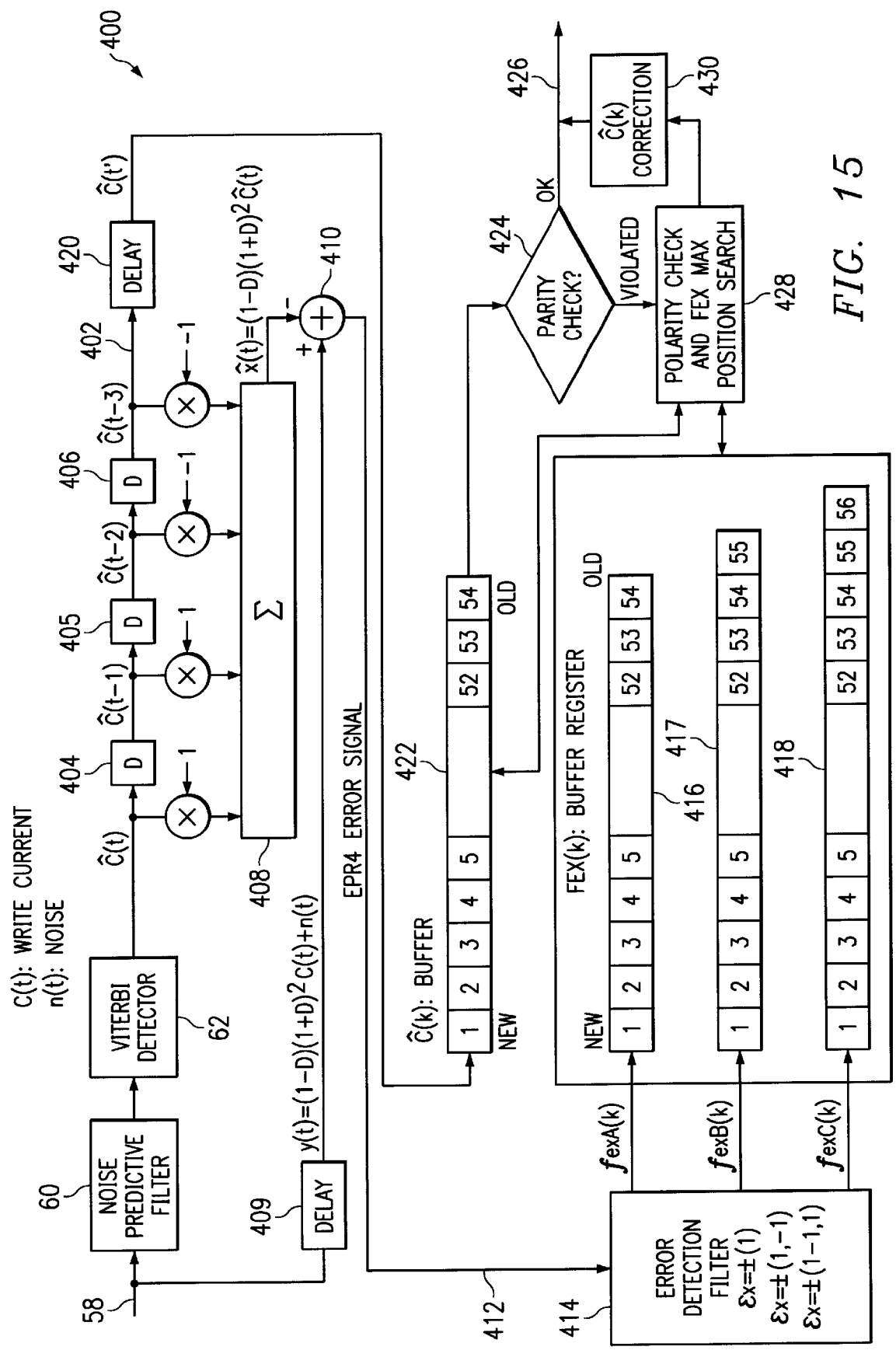
FIG. 15 is a diagram showing the manner in which the various error events are detected and corrected using the post-processor and parity error data, in accordance with a preferred embodiment of the invention.

FIG. 15 represents a block diagram 40 illustrating the operation of the parity check code post-processor 66 of a preferred embodiment of the invention. In FIG. 15, the input is received from the FIR filter 56 (see FIG. 6) of the partial response target equalizer 50 on line 58. The signal is applied to a noise predictive filter 60 and a Viterbi detector 62. The write current, denoted by Ĉ, is then recovered in a write recovery circuit 402, which includes three delay elements 404, 405, and 406. The values at each of the nodes of the write recovery circuit 402 are weighted and summed, as shown, in a summer circuit 408 to be subtracted from the delayed input signal by a summer circuit 410. The input signal on line 58 is delayed by a delay circuit 409 to be in proper phase with the output signal from the summer 408, which has experienced numerous delays during processing.

The output on line 412 carrying the error signal is applied to the FIR matched filters 110–112, which are collectively shown by box 414. As mentioned above, the outputs from the respective FIR matched filters 110–112 represent a sequence of values that become maximum when the sought for filtered event is found. The successive outputs of each filter are applied to buffer registers 416–418, which are sequentially loaded by the sequentially occurring values developed by the filters 110–112. It is noted that the length of buffers 416–418 vary, depending upon the particular filter with which it is associated.

The recovered write current Ĉ(t) is delayed by a delay element 420 to be synchronized with the data that is produced at the output of the respective FIR matched filter circuits 110–112, and is sequentially loaded into a buffer 422. The buffer 422 is of 54 bit length, as shown, which corresponds to the bit length of the frame that is defined, as discussed above, representing the concatenation of three words of 17 bit word length, plus the two parity and one pad bits.

The parity bits are then checked in a parity checker 424, and, if no parity error is detected, the contents of the buffer 422 is directly outputted on output line 426. On the other hand, if the parity check 424 indicates that a parity violation has occurred, the position of the maximum value contained in the particular appropriate register 416–418 is determined in block 428. The data in register 422 at the data location(s) corresponding to the maximum value contained in the selected register 416–418 is then flipped by a correction circuit 430. The correct data is thus outputted on the line 426.

Thus, the identification of the occurrence of a data error and its location is performed as a result of the operation of the maximum detector circuits 122–125 (FIG. 11) in conjunction with the parity error that has been determined. It can be seen, for example, that if the output from the FIR filter 110 reaches a maximum value, which indicates that a single bit has been flipped, the outputs from the maximum value detectors 122 and 123 would be maximum, producing signals on output lines 130 and 131 to the multiplexer 134. By the application of the proper parity error signal on one of lines 136–138, the output provided from the multiplexer 134 can be selected to represent either an even bit correction or an odd bit correction, depending upon which of the parity bit errors is applied to the multiplexer. As a result, the knowledge of the types of errors that cause certain parity errors can be used to decide which matched filter outputs and positions should be processed. For example, the output of the one bit FIR filter is ignored at even positions if an odd parity error was detected.

Thus, with reference again to FIG. 11, the error type that occurs is determined by the particular combination of parity errors that are detected and transmitted to the multiplexer 134 on lines 136 and 137 to be of type 0, 1, 2, or 3. Error types 1, 2 and 3 are illustrated in respective tables 500, 502, and 504 of FIG. 16, to which reference is now additionally made. More particularly, type 0 indicates that no error has occurred, type 1 indicates that an even parity violation has occurred, but no odd parity violation has occurred. Type 2 indicates that no even parity violation has occurred, but an odd parity violation has occurred. Type 3 indicates that both even and odd parity violations have occurred. With the error type being known, and the error position being determined by the maximum at the outputs of Filters A–C 110–112, the error can be easily corrected, in the output of the recovered write data.

Figure 16:
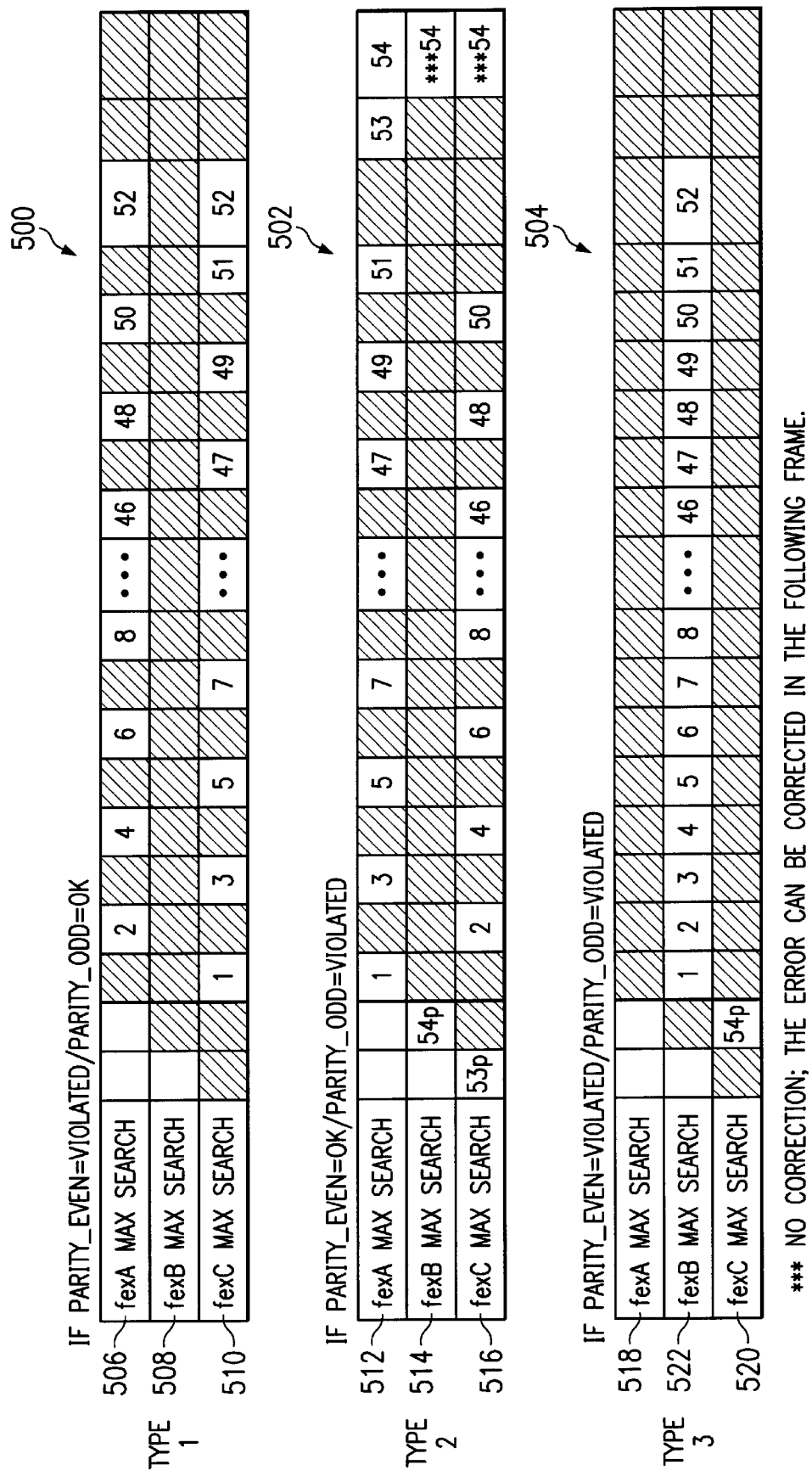
FIG. 16 shows three tables illustrating parity error types 1, 2, and 3 and the manner by which the parity type is used to identify the location of a data error in conjunction with a post-processor according to a preferred embodiment of the invention.

More particularly, the manner in which the position of an error is determined in a data frame and corrected can be seen from the tables 500, 502, and 504 of FIG. 16. Tables 500, 502, 504 respectively represent the different three parity error combinations that can occur when a violation occurs. Thus, table 500 represents the case in which the even parity is violated and the odd parity is ok. Table 502 represents the case in which the even parity is ok and the odd parity is violated. Table 504 represents the case in which both the even and odd parity are violated. Each row in each table represents the data bits of a data frame, including the parity and pad bits, plus two bits of the previous data frame.

Thus, with reference first to table 500, each row 506, 508 and 510 respectively represent the frame positions of maximum value detectors 110, 111, and 112, i.e., fexA, fexB, and fexC. It can be seen that in the case in which only even parity is violated, since the error condition of Filter B 111, ex=±{1,-1}, represents the case in which two consecutive data bits are flipped, an error cannot be indicated by this parity, case. As a result, no bit corrections are made to the bit locations in the second row 508. Thus, the multiplexer 134 (FIG. 11) is configured to not pass the output of Filter B 111 in this case.

On the other hand, in row 506, which represents the error conditions contained in the word frame, fexA, processed by the Filter A 110, ex=±{1}, since the even parity bits are violated, then bit corrections can be made to any of the even bit positions 2, 4, 6, 8, . . . as shown. Thus, the multiplexer 134 (FIG. 11) is configured to pass the output of Filter A 110 at its even bit positions in this case.

Furthermore, the data bit positions in row 510 represent the fexC output of Filter C 112, which detects the error pattern ex=±{1,-1,1}. This error pattern represents a condition in which three consecutive bits are flipped, and can be detected in errors in the odd bit positions 1, 3, 5, 7, . . . . For example, since the odd parity is detected as being ok, it can be concluded that two odd bit positions have been flipped, which would appear as odd parity being determined as ok, but, since the even parity is determined to have been violated, the even bit position plus the two adjacent odd bit positions needs to be flipped to be corrected. Thus, the multiplexer 134 is configured to pass the output of Filter C 112 at its odd bit positions in this case.

Table 502 represents the case in which an error has occurred with even parity determined to be ok and odd parity determined to be violated. Row 512 indicates the bit positions that are corrected when Filter A 110 detects the occurrence of an error in this case. Thus, a single flipped bit can be corrected in bit positions 1, 3, 5, 7, . . . . Therefore, the multiplexer 134 is configured to pass the output of Filter A 110 at its odd bit positions in this case.

Row 514 represents the correctable bit positions that are indicated by the Filter B 111, again representing an error condition ex=±{1,-1} in which two adjacent bit positions are flipped. Thus, for any of the bit positions in this case.

Row 516 represents the data stream fexC of Filter C 112. In a manner similar to that described above with respect to row 510, it should be noted that since three adjacent bits are flipped when an error of the type ex=±{1,-1,1} occurs, and the even parity checks ok, the location of the error can be determined to be spanning two even bit positions. Thus, the multiplexer 134 is configured to pass the output of Filter C 112 at its even bit positions in this case.

With reference now to table 504, it can be seen that the conditions in the first row 518 when both even and odd parity are violated is inconsistent with the error condition detected by Filters A, namely ex=±{1}. It is additionally inconsistent with the error condition detected by Filter C, since, as above described, the error condition ex=±{1,-1,1} results in either the even or odd parity testing ok, since a pair of either even or odd bits is flipped. As a result, no error conditions are corrected based upon the outputs of Filters A or C when both the even and odd parity test to be violated.

On the other hand, the error conditions represented in row 522, representing the search of the output states from Filter B 111, would result from the violation of both even and odd parity; consequently, any of the bit positions in the middle row 522 can be corrected under these conditions. Thus, the multiplexer 134 is configured to pass the output of Filter B 111 in this case.

It is noted that if a pad bit error is found in bit position 53 (see table 502) the fact that it has been found and the error type thereof is indicated, the pad bit can be corrected. Moreover, as shown the even and odd parity bits located in bit positions 52 and 54 respectively, can also be corrected using the techniques described above.

Figure 17:
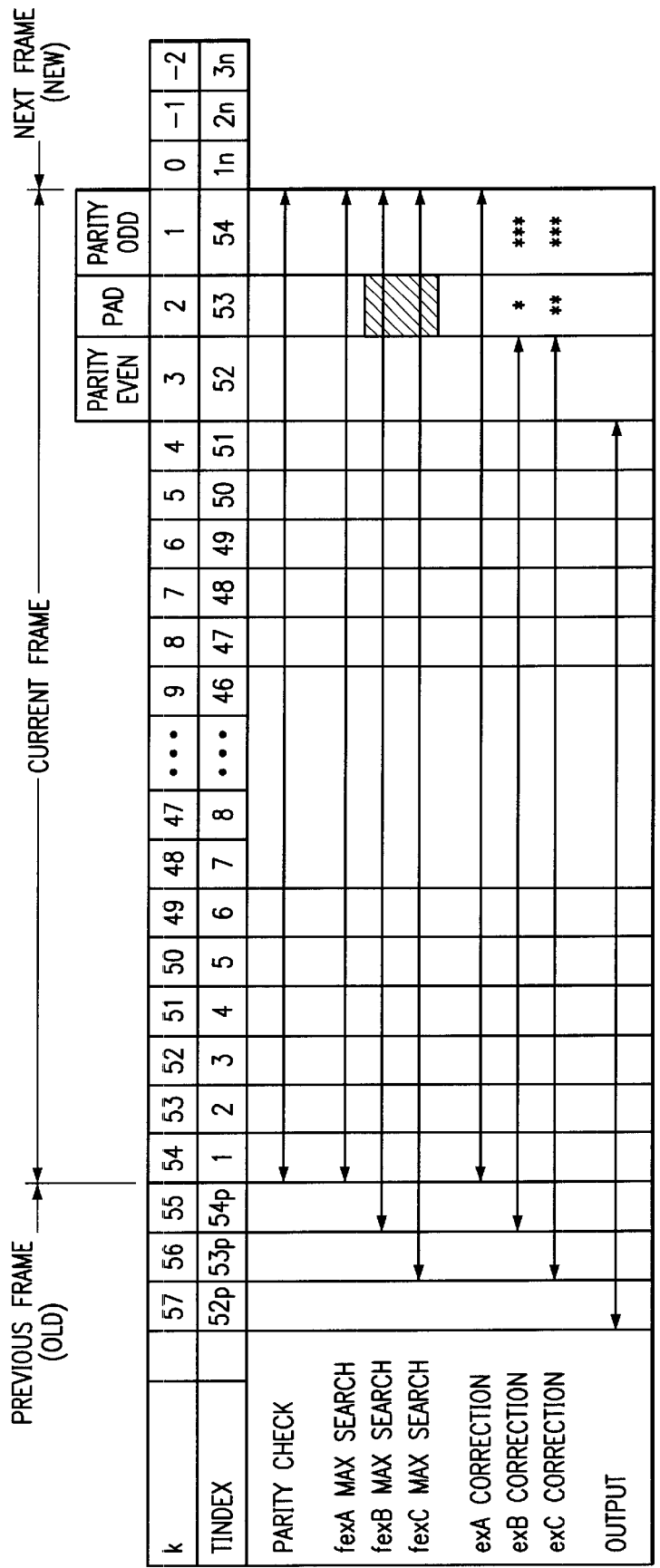
FIG. 17 shows a table illustrating the search span of the output data streams of the various filters used in the post-processor shown in FIG. 11 in determining the error position from the tables shown in FIG. 16.

A table showing the search span of the FIR matched filters 110–112 is shown in FIG. 17.

It should be noted that because of the timing involved, the processing is performed in the maximum value detection blocks or circuits before the actual parity error arrives. Since the processing needs to be done in advance of the detection of the parity error, a separate maximum value detector is used for each parity error case, and then the corresponding max detect output is selected when the parity signals are received.

Figure 18:
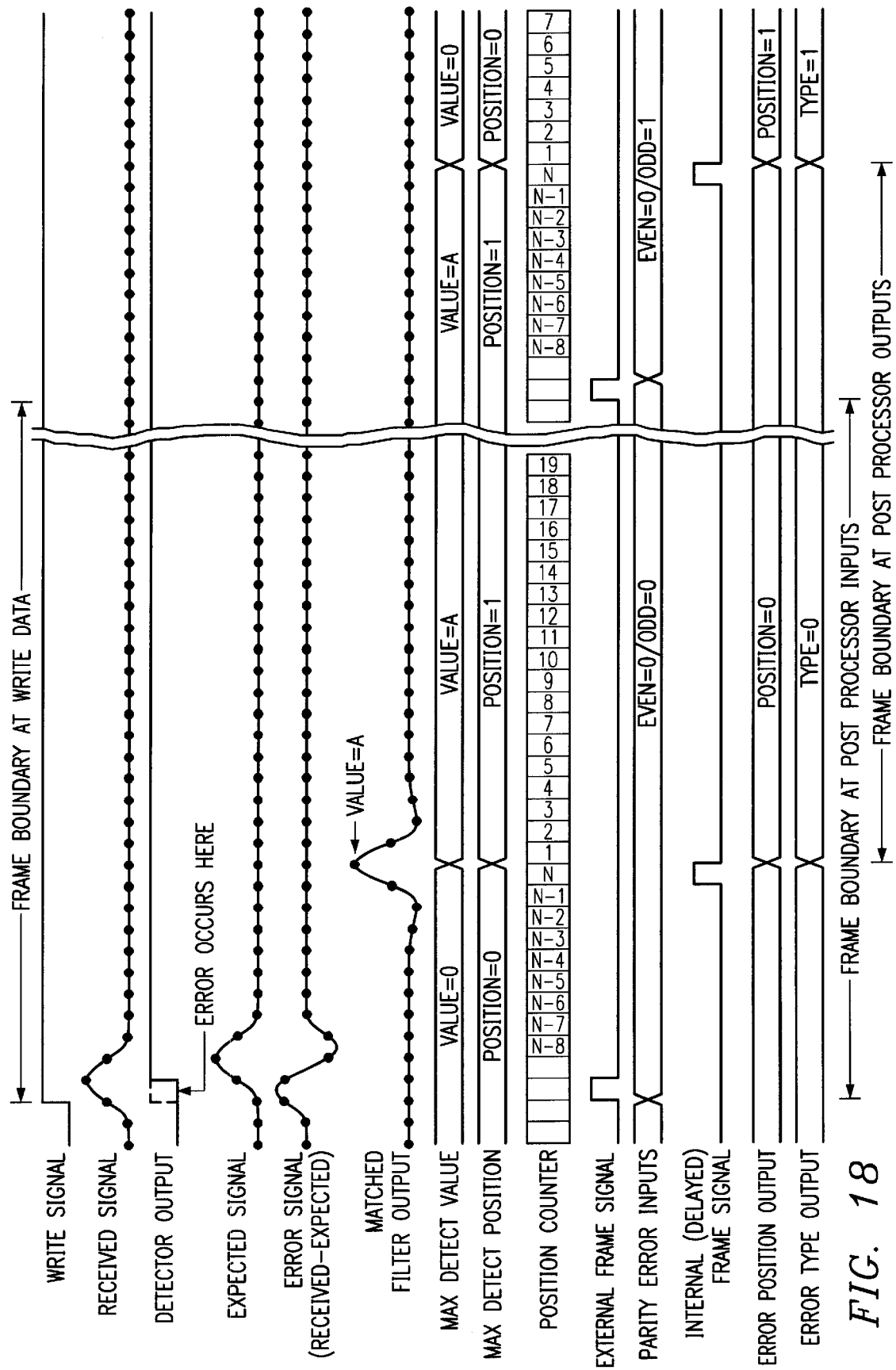
FIG. 18 shows a timing diagram illustrating some of the important signals for the used in the post-processor, according to a preferred embodiment of the invention.

A timing diagram showing some of the important signals for the used in the post-processor 66 is shown in FIG. 18. The waveforms of FIG. 18 show a 1-bit error as it propagates through the post-processor. Computation latency has generally been removed from this diagram, to simplify the description. (In general, every operation has some computation latency, and this makes many of the signals shift with respect to the signals from which they are generated.) The following sets of signals have been time shifted to remove latency effects:

Group 1:
Write Signal, Received Signal, Detector Output, Expected Signal, Error Signal, External Frame Signal, Parity Error Inputs Group 2:
Matched Filter Output, Max Detect Value, Max Detect Position, Position Counter, Internal Frame Signal, Error Position Output, Error Type Output Table 6 is a description of the waveforms shown in FIG. 18.

TABLE 6

| Name | Description |
| --- | --- |
| Write Signal | Write current written to the disk. If data is detected without error, then the detector output will match this waveform. |
| Received Signal | The signal received from the head as it scans across the disk. As the head passes over a transition, a pulse is produced. The pulse shown has been equalized to an EPR4 response. The normalized sample values are 1, 2, 1. |
| Detector Output | The data detected after processing the received signal. |
| Expected Signal | The signal that corresponds to the data that was actually detected. In this case, because the detector found the transition one position late, the expected signal is shifted one position late from the received signal. |
| Error Signal | The difference between the received signal and the expected signal. |
| Matched Filter Output | The output of the one-bit matched filter. The output contains a peak some time after the error signal is generated, due to the computation latency in the matched filter. |
| Max Detect Value | The maximum value detected at the matched filter output during a frame. |
| Max Detect Position | The position where the maximum value was found. This is the value of the position counter when the maximum value is detected. |
| Position Counter | A counter containing the current position within a data frame. Positions are numbered from 1 to N. |
| External Frame Signal | The frame signal received from the sync detect block. |
| Parity Error Inputs | Collectively, the even and odd parity bits, and the pad error bit. |
| Internal (Delayed) Frame Signal | A copy of the frame signal used inside the post-processor. It is delayed in time from the external frame signal. |
| Error Position Output | The position of the error, when an error is detected. |
| Error Type Output | The type of error detected. This is binary encoded:<br>0 = No error detected<br>1 = 1 bit error detected<br>2 = 2 bit error detected<br>3 = 3 bit error detected. |

As described above, there are four maximum value in the post-processor 66. Each maximum value detectors 122–125 looks at a different combination of matched filter outputs and positions, corresponding to the error sequences and positions Chat cause a particular parity error case. This example shows a one-bit error at position 1. This will be detected by the max detect block that detects one bit errors in odd positions.

The values contained in the maximum value detectors 122–125 are reset to zero at the beginning of each frame. When the matched filter output exceeds a programmable threshold value, the value of the maximum value detectors are set to the value of the associated matched filter output. This value is held until a larger matched filter output is detected or until the end of the frame, when the value of the maximum value detectors is reset to zero. Every time a new maximum value is found, the position of the maximum value is recorded by saving the value of a counter. The counter is reset to "1" at the beginning of each frame, and increments at each clock to a maximum value of N at the last position in a frame, where N is the number of bits in a frame.

The external frame signal is delayed for use inside the post-processor. When the delayed frame signal occurs, the position value recorded in the maximum value detectors 122–125 is saved to a register, along with a type value that indicates which matched filter the maximum value came from. These values are output to the error correction block as Error Position Output and Error Type Output, respectively.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for writing data to a mass data storage device comprising:
   applying a maximum transition run length code constraint to the data to be written;
   developing parity data including three parity bits, a center one of said parity bits being a "pad" bit and based on the predetermined number of bits of the data to be written;
   concatenating the parity data with said data to be written; and writing said concatenated data to said mass data storage device.

2. The method of claim 1 further comprising configuring said "pad" bit to avoid code constraint violations by said parity data concatenated to said data to be written.

3. The method of claim 2 wherein said configuring said "pad" bit to avoid code constraint violations by said parity data concatenated to said data to be written comprises providing a pad bit value of "1" if a last bit position of a preceding data frame and a first bit position of a succeeding data frame are both "0", and otherwise providing a pad bit value of "0".

4. The method of claim 1 wherein said pad bit is modified so that maximum transition run length code violations do not occur for different possible parity combinations in conjunction with possible data configurations in last two and first two bit positions of said predetermined number of bits of the data to be written.

5. The method of claim 1 wherein said data to be written is segmented into 51 bit frames and said parity bits are concatenated onto said frames.

6. The method of claim 1 wherein said applying a maximum transition run length code constraint to the data to be written comprises applying an MTR(3:k) code constraint.

7. The method of claim 1 wherein said applying a maximum transition run length code constraint to the data to be written comprises applying an MTR(3:11) code constraint.

8. The method of claim 1 wherein said applying a maximum transition run length code constraint to the data to be written comprises applying a 48/54 MTR(3:11) code.

9. A method for operating a mass data storage device comprising:

reading data from a memory element of said mass data storage device, said data having been previously arranged with MTR encoded data words concatenated with parity information including three parity bits, a center one of said parity bits being a "pad" bit, whereby said parity information does not cause MTR code violations in conjunction with possible bit states of said MTR encoded data word;

equalizing said read back data to an EPR4 target;

post-processing said equalized data, wherein if an error is indicated by said post-processor, said read back data is corrected by said post-processor using said parity information.

10. The method of claim 9 wherein said post-processing comprises:

filtering read back data to determine the occurrence of a likely to occur error event;

determining parity information of said read back data;

generating parity information from said read back data;

comparing determined and generated parity information to determine whether a parity error has occurred; and using said filtered read back data and said parity error information to correct the read back data.

11. A post-processor for use in a mass data storage device to which parity information including three parity bits, a center one of said parity bits being a "pad" bit and has been written together with MTR encoded data, comprising:

a filter connected to receive data and parity information which has been read back from said mass data storage device to produce an error indicating output in the presence of a predetermined error pattern;

a parity checker to determine if a parity error has occurred in the read back data by using the three parity bits;

and a circuit for correcting the read back data at a bit position indicated by said error indicating output when said parity checker determines that a parity error has occurred.

12. The post-processor of claim 11 wherein said applying a maximum transition run length code constraint to the data to be written comprises applying a 48/54 MTR(3:11) code.

13. The post-processor of claim 11 further comprising an equalizer to equalize data and said parity information read back from said mass data storage device to and EPR4 target.

14. A mass data storage device, comprising:

a circuit for encoding data to be written to said mass data storage device with at least a maximum transition run length constraint;

a circuit for determining parity information including three parity bits, a center one of said parity bits being a "pad" bit, from and associating said parity information with, said data to be written;

a circuit for writing said data and parity information to a storage media of said mass data storage device;

a circuit to read back said data and parity information from said storage media;

a parity checker to recalculate parity information from said read back data and to produce an output indicating whether the read back parity and recalculated parity information do not match;

a post-processor circuit Including at least one filter to detect an error pattern in said read back data, and to correct said read back data using said parity checker output if said error pattern is detected.

15. The mass data storage device of claim 14 wherein said parity information is concatenated between adjacent data frames, and includes parity information about even bits in a data frame, parity information about odd bits in said data frame, and a pad bit that is configured to assure that no maximum transition run length code constraint is violated when said parity information is concatenated between adjacent data frames.

16. The mass data storage device of claim 14 wherein said filter is connected to receive read back data to produce a maximum output in the presence of a predetermined error pattern.

17. The mass data storage device of claim 14 wherein said post-processor includes three filters to respectively determine the occurrence of ex=±{1}, ex={1,−1}, and ex=±{1,−1,1} error event contributors.

18. The mass data storage device of claim 14 further comprising an equalizer to equalize data and said parity information read back from said mass data storage device to an EPR4 target.

* * * * *